(12) United States Patent
Park et al.

(10) Patent No.: US 11,967,367 B2
(45) Date of Patent: Apr. 23, 2024

(54) NONVOLATILE MEMORY DEVICE AND STORAGE DEVICE INCLUDING NONVOLATILE MEMORY DEVICE

(71) Applicant: SAMSUNG ELECTRONICS CO., LTD., Suwon-si (KR)

(72) Inventors: Gyu-Ha Park, Hwaseong-si (KR); Jeongyeol Kim, Changwon-si (KR); Nari Lee, Hwaseong-si (KR); Daehan Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 36 days.

(21) Appl. No.: 17/806,103

(22) Filed: Jun. 9, 2022

(65) Prior Publication Data
US 2023/0110663 A1   Apr. 13, 2023

(30) Foreign Application Priority Data

Oct. 7, 2021   (KR) .................. 10-2021-0133474

(51) Int. Cl.
G11C 11/56   (2006.01)
G11C 16/04   (2006.01)
G11C 16/08   (2006.01)
G11C 16/10   (2006.01)
G11C 16/24   (2006.01)
G11C 16/34   (2006.01)
G11C 29/00   (2006.01)
G11C 29/54   (2006.01)

(52) U.S. Cl.
CPC ...... *G11C 11/5628* (2013.01); *G11C 11/5671* (2013.01); *G11C 16/0483* (2013.01); *G11C 16/08* (2013.01); *G11C 16/10* (2013.01); *G11C 16/24* (2013.01); *G11C 16/3459* (2013.01); *G11C 29/54* (2013.01)

(58) Field of Classification Search
USPC ................................ 365/200, 201, 185.09
See application file for complete search history.

(56) References Cited

U.S. PATENT DOCUMENTS

| | | | |
|---|---|---|---|
| 7,679,133 B2 | 3/2010 | Son et al. | |
| 8,553,466 B2 | 10/2013 | Han et al. | |
| 8,559,235 B2 | 10/2013 | Yoon et al. | |
| 8,630,118 B2 | 1/2014 | Sakai et al. | |
| 8,654,587 B2 | 2/2014 | Yoon et al. | |

(Continued)

FOREIGN PATENT DOCUMENTS

| | | |
|---|---|---|
| KR | 10-1958508 | 7/2019 |
| KR | 10-2021-0092860 | 7/2021 |

*Primary Examiner* — Tan T. Nguyen
(74) *Attorney, Agent, or Firm* — F. Chau & Associates, LLC

(57) ABSTRACT

Disclosed is a nonvolatile memory device which includes a memory cell array, a row decoder circuit that selects one wordline as a target of a program operation, a page buffer circuit that stores data to be written in memory cells connected with the selected wordline in the program operation, and a pass/fail check circuit that determines a pass or a fail of the program operation. In the program operation, the pass/fail check circuit detects a first program speed of first memory cells and a second program speed of second memory cells, and determines a program fail based on the first program speed and the second program speed.

20 Claims, 19 Drawing Sheets

(56) References Cited

U.S. PATENT DOCUMENTS

| | | |
|---|---|---|
| 8,775,901 B2 | 7/2014 | Sharon et al. |
| 9,070,449 B2 | 6/2015 | Yang et al. |
| 9,165,683 B2 | 10/2015 | Tam |
| 9,183,081 B2 | 11/2015 | Manohar et al. |
| 9,214,206 B2 | 12/2015 | Park et al. |
| 9,224,495 B2 | 12/2015 | Jung et al. |
| 9,455,048 B2 | 9/2016 | Berckmann et al. |
| 9,564,219 B2 | 2/2017 | Magia et al. |
| 10,529,435 B2 | 1/2020 | Puthenthermadam et al. |
| 10,699,788 B2 | 6/2020 | Lee |
| 10,832,784 B2 | 11/2020 | Sharma et al. |
| 2011/0233648 A1 | 9/2011 | Seol et al. |
| 2013/0088930 A1* | 4/2013 | Cho ................... G11C 7/10 365/189.05 |
| 2018/0350440 A1* | 12/2018 | Jang ................. G11C 16/345 |
| 2019/0206497 A1* | 7/2019 | Lim ................... G11C 16/08 |
| 2021/0098070 A1 | 4/2021 | Lee |
| 2021/0225450 A1 | 7/2021 | Park et al. |
| 2022/0208290 A1* | 6/2022 | Hwang ............... G11C 16/10 |

\* cited by examiner

NONVOLATILE MEMORY DEVICE AND STORAGE DEVICE INCLUDING NONVOLATILE MEMORY DEVICE

CROSS-REFERENCE TO RELATED APPLICATIONS

This U.S. non-provisional patent application claims priority under 35 U.S.C. § 119 to Korean Patent Application No. 10-2021-0133474 filed on Oct. 7, 2021, in the Korean Intellectual Property Office, the disclosure of which is incorporated by reference in its entirety herein.

1. Technical Field

Embodiments of the present disclosure described herein relate to an electronic device, and more particularly, relate to a nonvolatile memory device for detecting a resistive fault and a storage device including the nonvolatile memory device.

2. Discussion of Related Art

A storage device stores data under control of a host device, such as a computer, a smartphone, or a smart pad. The storage device may include a device, which stores data on a magnetic disk, such as a hard disk drive (HDD), or a device, which stores data in a semiconductor memory. The semiconductor memory may be a nonvolatile memory, such as a solid state drive (SSD) or a memory card.

A nonvolatile memory includes a read only memory (ROM), a programmable ROM (PROM), an electrically programmable ROM (EPROM), an electrically erasable and programmable ROM (EEPROM), a flash memory, a phase-change random access memory (PRAM), a magnetic RAM (MRAM), a resistive RAM (RRAM), a ferroelectric RAM (FRAM), etc.

A VNAND is an example of a nonvolatile memory where the memory cells are stacked vertically. Word lines connected with the memory cells may be connected with a circuit through vias. However, during a process of manufacturing the vias, some of the vias may become disconnected or have a higher than intended resistance.

SUMMARY

At least one embodiment of the present disclosure provides a nonvolatile memory device with increased reliability and a storage device including the nonvolatile memory device.

According to an embodiment, a nonvolatile memory device includes a memory cell array, a row decoder circuit, a page buffer circuit, and a pass/fail check circuit. The memory cell array includes memory cells arranged in rows and columns. Two or more of the memory cells are stacked in a direction perpendicular to a substrate. The row decoder circuit is connected with the rows of the memory cells through wordlines and selects one wordline of the wordlines as a target of a program operation in the program operation. The page buffer circuit is connected with the columns of the memory cells through bitlines and stores data to be written in memory cells connected with the selected wordline in the program operation. The pass/fail check circuit is connected with the page buffer circuit and determines a pass or a fail of the program operation in the program operation. The bitlines include bitlines of a first bitline group and bitlines of a second bitline group. In the program operation, the pass/fail check circuit detects a first program speed of first memory cells connected with the bitlines of the first bitline group from among the memory cells connected with the selected wordline and a second program speed of second memory cells connected with the bitlines of the second bitline group from among the memory cells connected with the selected wordline, and determines a program fail based on the first program speed and the second program speed.

According to an embodiment, a nonvolatile memory device includes a memory cell array, a row decoder circuit, a page buffer circuit, and a pass/fail check circuit. The memory cell array includes memory cells arranged in rows and columns, wherein two or more of the memory cells are stacked in a direction perpendicular to a substrate. The row decoder circuit is connected with the rows of the memory cells through wordlines and selects one wordline of the wordlines in a test operation including a first program operation and a second program operation as a target of the first and second program operations. The page buffer circuit is connected with the columns of the memory cells through bitlines and stores first data to be written in memory cells connected with the selected wordline in the first program operation and to store second data to be written in the memory cells connected with the selected wordline in the second program operation. The pass/fail check circuit is connected with the page buffer circuit and determines a pass or a fail of each of the first program operation and the second program operation in the test operation. The pass/fail check circuit detects a first program speed from the memory cells connected with the selected wordline in the first program operation, detects a second program speed from the memory cells connected with the selected wordline in the second program operation, and determines a test fail based on the first program speed and the second program speed.

According to an embodiment, a storage device includes a nonvolatile memory device and a memory controller. The memory device includes a memory cell array including a plurality of memory cells connected with a plurality of wordlines and a plurality of bitlines. Two or more of the memory cells are stacked in a direction perpendicular to a substrate. The memory controller is connected with the nonvolatile memory device to control the nonvolatile memory device. When a test command is provided from the memory controller, the nonvolatile memory device detects a difference between program speeds of memory cells connected with a selected wordline of the plurality of wordlines by performing at least one program operation on the memory cells connected with the selected wordline based on test data and sends a program status fail signal to the memory controller when the difference between the program speeds is greater than a threshold. The memory controller sends the test command to the nonvolatile memory device based on the number of program/erase cycles of the nonvolatile memory device, a temperature profile of the nonvolatile memory device, or when a program fail occurs in the nonvolatile memory device.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure will be described in detail and clearly to such an extent that of an ordinary one in the art may implement the present disclosure. Below, the term "and/or" is interpreted as including any one of items listed with regard to the term, or a combination of some of the listed items.

Figure 1:
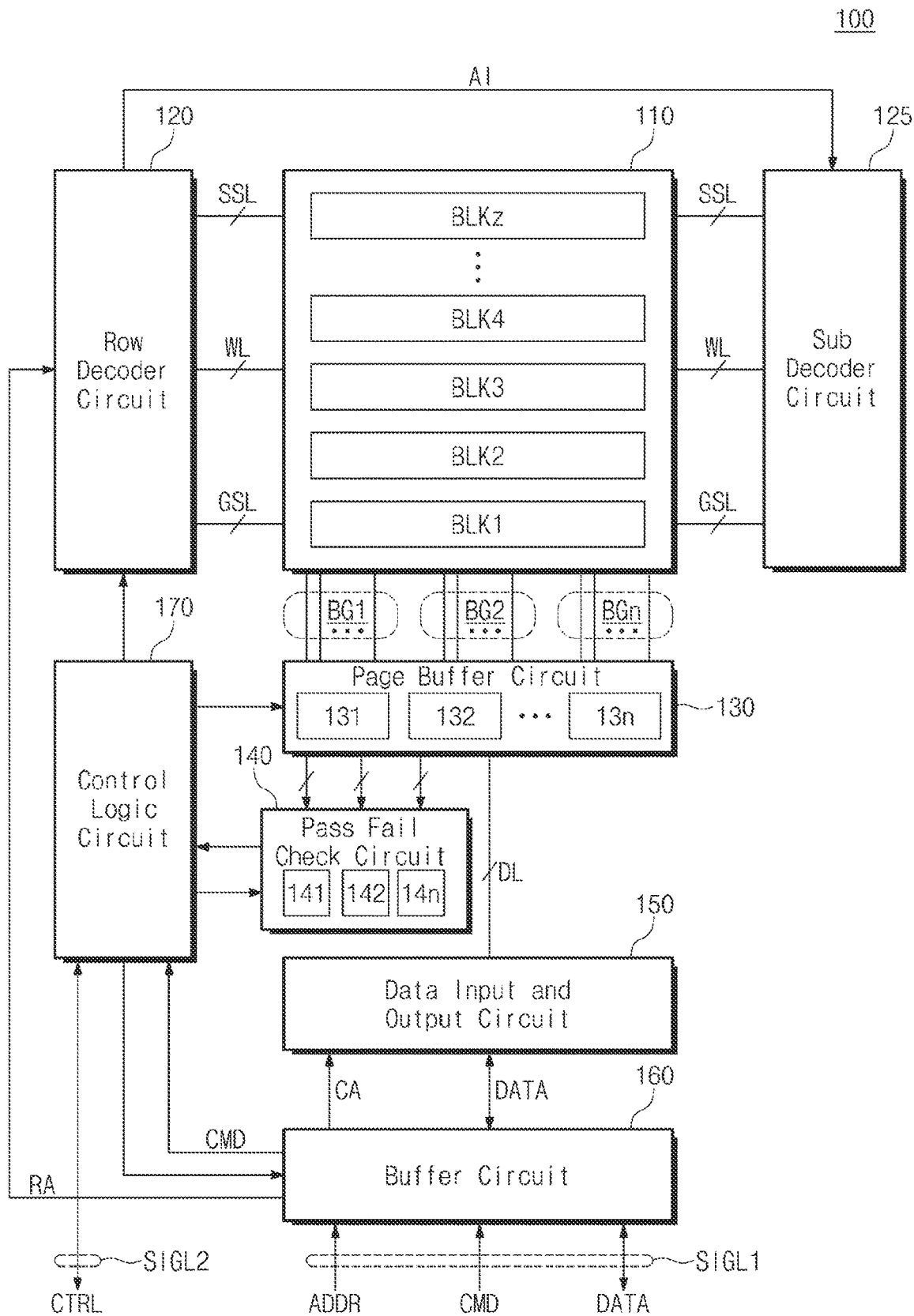
FIG. 1 is a block diagram illustrating a nonvolatile memory device according to an embodiment of the present disclosure.

FIG. 1 is a block diagram illustrating a nonvolatile memory device 100 according to an embodiment of the present disclosure. Referring to FIG. 1, the nonvolatile memory device 100 includes a memory cell array 110, a row decoder circuit 120, a sub decoder circuit 125, a page buffer circuit 130, a pass/fail check circuit (PFC) 140, a data input and output circuit 150, a buffer circuit 160, and a control logic circuit 170.

The memory cell array 110 includes a plurality of memory blocks BLK1 to BLKz. Each of the memory blocks BLK1 to BLKz includes a plurality of memory cells. Each of the memory blocks BLK1 to BLKz may be connected with the row decoder circuit 120 through at least one ground selection line GSL, wordlines WL, and at least one string selection line SSL. Some of the wordlines WL may be used as dummy wordlines. Each of the memory blocks BLK1 to BLKz may be connected with the page buffer circuit 130 through a plurality of bitlines BL. The plurality of memory blocks BLK1 to BLKz may be connected in common with bitlines of first to n-th bitline groups BG1 to BGn.

In an embodiment, each of the plurality of memory blocks BLK1 to BLKz may be a unit of an erase operation. Memory cells belonging to each of the memory blocks BLK1 to BLKz may be erased at the same time. As another example, each of the memory blocks BLK1 to BLKz may be divided into a plurality of sub-blocks. Each of the plurality of sub-blocks may correspond to a unit of the erase operation.

The row decoder circuit 120 is connected with the memory cell array 110 through the ground selection lines GSL, the wordlines WL, and the string selection lines SSL. The row decoder circuit 120 operates under control of the control logic circuit 170.

The row decoder circuit 120 may decode a row address RA received from the buffer circuit 160 and may control voltages to be applied to the string selection lines SSL, the wordlines WL, and the ground selection lines GSL based on the decoded row address.

The sub decoder circuit 125 is connected with the memory cell array 110 through the ground selection lines GSL, the wordlines WL, and the string selection lines SSL. The sub decoder circuit 125 operates under control of the control logic circuit 170.

The sub decoder circuit 125 may receive address information AI from the row decoder circuit 120. For example, the address information AI may include the row address decoded by the row decoder circuit 120. The sub decoder circuit 125 may control voltages to be applied to the string selection lines SSL, the wordlines WL, and the ground selection lines GSL based on the address information AI.

As another example, the address information AI may include the row address RA. The sub decoder circuit 125 may decode the address information AI and may control voltages to be applied to the string selection lines SSL, the wordlines WL, and the ground selection lines GSL based on the decoded address information.

The row decoder circuit 120 and the sub decoder circuit 125 may be connected to opposite ends (or sides) of the memory cell array 110. On one side of the memory cell array 110, the row decoder circuit 120 may apply voltages to the string selection lines SSL, the wordlines WL, and the ground selection lines GSL. On an opposite side of the memory cell array 110, the sub decoder circuit 125 may apply voltages to the string selection lines SSL, the wordlines WL, and the ground selection lines GSL. As voltages are supplied from the opposite sides of the memory cell array 110 through the row decoder circuit 120 and the sub decoder circuit 125, the voltages of the string selection lines SSL, the wordlines WL, and the ground selection lines GSL may be stably driven.

The page buffer circuit 130 is connected with the memory cell array 110 through the bitlines of the first to n-th bitline groups BG1 to BGn (n being an integer). The page buffer circuit 130 is connected with the data input and output circuit 150 through a plurality of data lines DL. The page buffer circuit 130 operates under control of the control logic circuit 170.

The page buffer circuit 130 may include first to n-th page buffers 131 to 13n. The first to n-th page buffers 131 to 13n may correspond to the first to n-th bitline groups BG1 to BGn, respectively. For example, the first page buffer 131 may be connected with the bitlines of the first bitline group BG1. The second page buffer 132 may be connected with the bitlines of the second bitline group BG2. The n-th page buffer 13n may be connected with the bitlines of the n-th bitline group BGn.

In a program operation, the first to n-th page buffers 131 to 13n of the page buffer circuit 130 may store data to be written in memory cells. The first to n-th page buffers 131 to 13n of the page buffer circuit 130 may apply voltages to the bitlines of the first to n-th bitline groups BG1 to BGn, based on the stored data. In a read operation or in a verify read operation associated with the program operation or an erase operation, the first to n-th page buffers 131 to 13n of the page buffer circuit 130 may sense voltages of the bitlines of the first to n-th bitline groups BG1 to BGn to generate a sensing result and may store the sensing result.

In the verify read operation associated with the program operation or the verify read operation associated with the erase operation, the pass/fail check circuit 140 may verify the sensing result of the page buffer circuit 130. The pass/fail check circuit 140 may include first to n-th sub check circuits 141 to 14n. The first to n-th sub check circuits 141 to 14n may correspond to the first to n-th bitline groups BG1 to BGn, respectively.

For example, in the verify read operation associated with the program operation, the first sub check circuit 141 may determine a pass or a fail based on a result of the verify read operation sensed by the first page buffer 131, that is, a result of the verify read operation for memory cells connected with the first bitline group BG1. The first sub check circuit 141 may count the number of values (e.g., "0") corresponding to on-cells that are not programmed to have a threshold voltage greater than or equal to a target threshold voltage (or the number of values corresponding to fail bits).

In the verify read operation associated with the erase operation, the first sub check circuit 141 may determine a pass or a fail based on a result of the verify read operation sensed by the first page buffer 131, that is, a result of the verify read operation for memory cells connected with the first bitline group BG1. The first sub check circuit 141 may count the number of values (e.g., "1") corresponding to off-cells that are not erased to have a threshold voltage less than or equal to a target threshold voltage (or the number of values corresponding to fail bits).

When a counting result is greater than or equal to a threshold value, the first sub check circuit 141 may output a signal indicating the fail to the control logic circuit 170. When the counting result is smaller than the threshold value, the first sub check circuit 141 may output a signal indicating the pass to the control logic circuit 170.

Likewise, the second sub check circuit 142 may determine a pass or a fail based on a result of the verify read operation (e.g., the verify read operation associated with the program operation or the erase operation) sensed by the second page buffer 132, that is, a result of the verify read operation for memory cells connected with the second bitline group BG2.

The n-th sub check circuit 14n may determine a pass or a fail based on a result of the verify read operation (e.g., the verify read operation associated with the program operation or the erase operation) sensed by the n-th page buffer 13n, that is, a result of the verify read operation for memory cells connected with the n-th bitline group BGn.

The pass/fail check circuit 140 may receive a pass signal or a fail signal from each of the first to n-th sub check circuits 141 to 14n. The pass/fail check circuit 140 may determine a program or erase pass, in response to that the pass signal is received from each of the first to n-th sub check circuits 141 to 14n. The pass/fail check circuit 140 may determine a program or erase fail, in response to that the fail signal is received from at least one of the first to n-th sub check circuits 141 to 14n. The pass/fail check circuit 140 may provide the control logic circuit 170 with the pass signal (e.g., an integrated pass signal) indicating the program or erase pass or the fail signal (e.g., an integrated fail signal) indicating the program or erase fail.

In an embodiment, the first sub check circuit 141 may detect a program speed of the memory cells of the first bitline group BG1. The second sub check circuit 142 may detect a program speed of the memory cells of the second bitline group BG2. The n-th sub check circuit 14n may detect a program speed of the memory cells of the n-th bitline group BGn. For example, to detect the program speed, each of the first to n-th sub check circuits 141 to 14n may count the number of times that a program loop is performed or may count the number of fail bits. For example, the first to n-th sub check circuits 141 to 14n may count the number of times that a program loop is performed until the program operation is completed (e.g., program passed) to determine the program speed.

In an embodiment, the pass/fail check circuit 140 may additionally determine the program fail based on the program speeds (e.g., differences between the program speeds) detected by the first to n-th sub check circuits 141 to 14n. That is, with regard to memory cells connected with a wordline selected by the row decoder circuit 120, the pass/fail check circuit 140 may additionally determine the program fail based on a difference between program speeds according to locations of the memory cells (e.g., a distance from the row decoder circuit 120). For example, if the difference in program speeds of the memory cells of the first bitline group BG1 and the second bitline group BG2 is small but the difference in program speeds of the memory cells of the second bitline group BG2 and the n-th bitline group BGn is large, it could be inferred that a failure has occurred within a programming of the memory cells of the n-th bitline group BGn.

In an embodiment, each of the first to n-th bitline groups BG1 to BGn may include bitlines that are physically adjacent to each other. Each of the first to n-th page buffers 131 to 13n may sense voltages of the physically adjacent bitlines. Each of the first to n-th sub check circuits 141 to 14n may determine the pass or the fail based on the physically adjacent bitlines.

The data input and output circuit 150 is connected with the page buffer circuit 130 through the plurality of data lines DL. The data input and output circuit 150 may receive a column address CA from the buffer circuit 160. The data input and output circuit 150 may output data read by the page buffer circuit 130 to the buffer circuit 160 depending on the column address CA. The data input and output circuit 150 may transfer data received from the buffer circuit 160 to the page buffer circuit 130, depending the column address CA.

Through first signal lines SIGL1, the buffer circuit 160 may receive a command CMD and an address ADDR from an external device and may exchange data "DATA" with the external device. The buffer circuit 160 may operate under control of the control logic circuit 170. The buffer circuit 160 may transfer the command CMD to the control logic circuit 170. The buffer circuit 160 may transfer the row address RA of the address ADDR to the row decoder circuit 120 and may transfer the column address CA of the address ADDR to the data input and output circuit 150. The buffer circuit 160 may exchange the data "DATA" with the data input and output circuit 150.

The control logic circuit 170 may exchange a control signal CTRL with the external device through second signal lines SIGL2. The control logic circuit 170 may allow the buffer circuit 160 to transfer the command CMD, the address ADDR, and the data "DATA" to the control logic circuit 170, the row decoder circuit 120, and the data input and output circuit 150, respectively. The control logic circuit 170 may decode the command CMD received from the buffer circuit 160 and may control the nonvolatile memory device 100 depending on the decoded command.

In the above embodiment, the description is given as the pass/fail check circuit 140 provides the integrated pass signal or the integrated fail signal to the control logic circuit 170 based on the pass signals or the fail signals of the first to n-th sub check circuits 141 to 14n. However, the first to n-th sub check circuits 141 to 14n of the pass/fail check circuit 140 may directly provide the pass signals or the fail signals to the control logic circuit 170. Also, the first to n-th sub check circuits 141 to 14n may directly provide information of the program speeds to the control logic circuit 170.

The control logic circuit 170 may determine an integrated pass or an integrated fail based on the pass signals or the fail signals provided from the first to n-th sub check circuits 141 to 14n. The control logic circuit 170 may additionally determine the program fail based on the information of the program speeds provided from the first to n-th sub check circuits 141 to 14n.

In an embodiment, the nonvolatile memory device 100 may be manufactured in a bonding manner. The memory cell array 110 may be manufactured on a first wafer, and the row decoder circuit 120, the sub decoder circuit 125, the page buffer circuit 130, the data input and output circuit 150, the buffer circuit 160, and the control logic circuit 170 may be manufactured on a second wafer. The nonvolatile memory device 100 may be implemented by coupling the first wafer and the second wafer such that an upper surface of the first wafer and an upper surface of the second wafer face each other.

As another example, the nonvolatile memory device 100 may be manufactured in a cell over peri (COP) manner. A peripheral circuit including the row decoder circuit 120, the sub decoder circuit 125, the page buffer circuit 130, the data input and output circuit 150, the buffer circuit 160, and the control logic circuit 170 may be formed on a substrate. The memory cell array 110 may be formed over the peripheral circuit. The peripheral circuit and the memory cell array 110 may be connected by using through vias.

Figure 2:
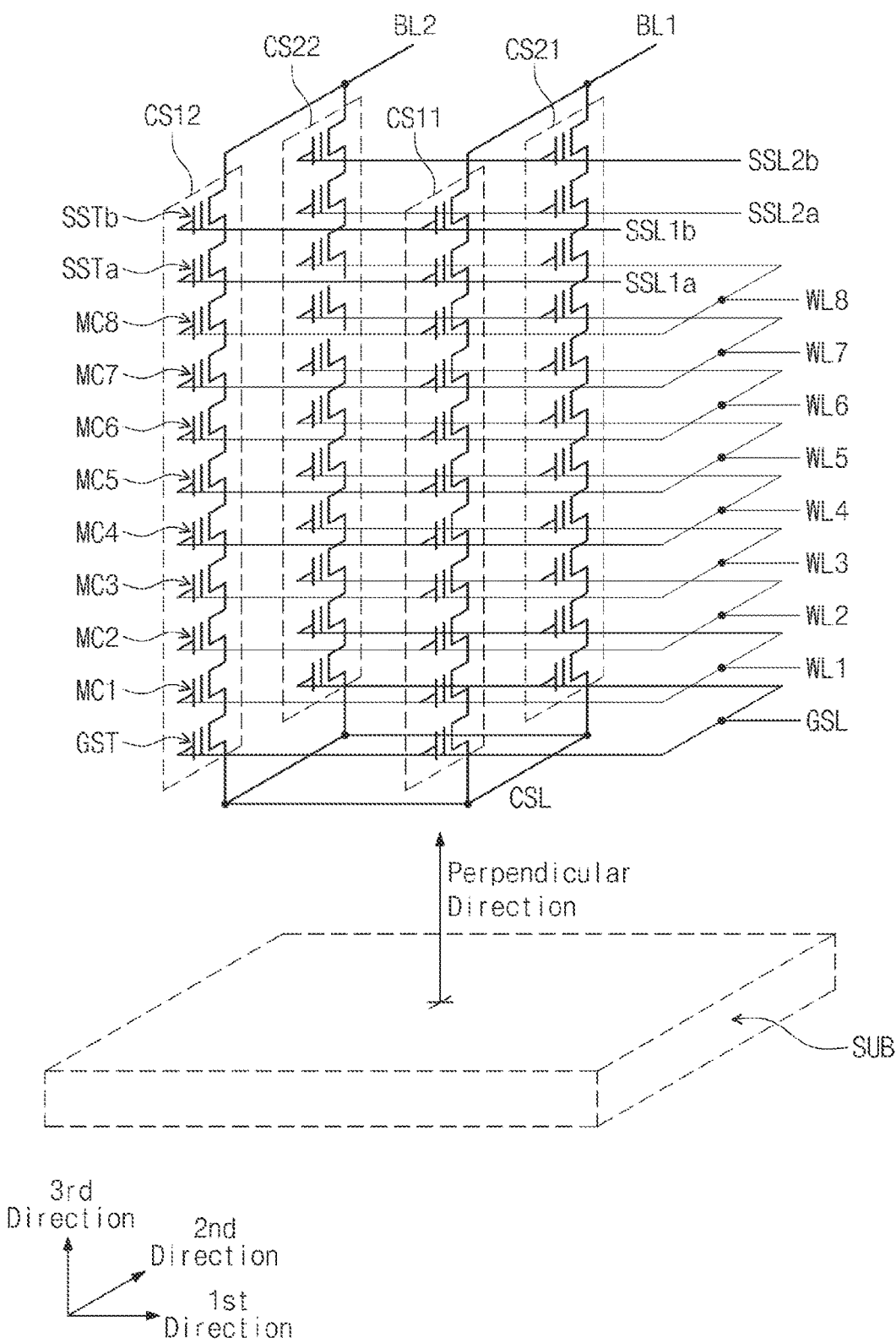
FIG. 2 is a circuit diagram illustrating an example of one memory block of memory blocks of FIG. 1.

FIG. 2 is a circuit diagram of an example of one memory block BLKa of the memory blocks BLK1 to BLKz of FIG. 1. Referring to FIG. 2, a plurality of cell strings CS11, CS12, CS21, and CS22 may be arranged on a substrate SUB in rows and columns. Each row may extend in a first direction. Each column may extend in a second direction. The plurality of cell strings CS11, CS12, CS21, and CS22 may be connected in common with a common source line CSL formed on (or in) the substrate SUB. In FIG. 2, a location of the substrate SUB is depicted as an example for better understanding of the structure of the memory block BLKa.

Cell strings of each row may be connected in common with the ground selection line GSL and may be connected with corresponding string selection lines of first string selection lines SSL1a and SSL1b and second string selection lines SSL2a to SSL2b. Cell strings of each column may be connected with a corresponding bitline of first and second bitlines BL1 and BL2. For example, the first and second bitlines BL1 and BL2 may be included in the bitlines of the first bitline group BG1, the bitlines of the second bitline group BG2, or the bitlines of the third bitline group BG3.

Each cell string may include at least one ground selection transistor GST connected with the ground selection line GSL, and a plurality of memory cells MC1 to MC8 respectively connected with a plurality of wordlines WL1 to WL8. Cell strings of a first row may further include string selection transistors SSTa and SSTb connected with the first string selection lines SSL1a and SSL1b. Cell strings of a second row may further include string selection transistors SSTa and SSTb connected with the second string selection lines SSL2a and SSL2b.

In each cell string, the ground selection transistor GST, the memory cells MC1 to MC8, and the string selection transistors SSTa and SSTb may be connected in series in a direction perpendicular to the substrate SUB, for example, a third direction and may be sequentially stacked in the direction perpendicular to the substrate SUB. In each of the cell strings CS11, CS12, CS21, and CS22, at least one of the memory cells MC1 to MC8 may be used as a dummy memory cell. The dummy memory cell may not be programmed (e.g., may be program-inhibited) or may be programmed differently from the remaining memory cells of the memory cells MC1 to MC8 other than the dummy memory cell.

In an embodiment, memory cells that are placed at the same height and are associated with one string selection line SSL1a, SSL1b, SSL2a, or SSL2b may form one physical page. Memory cells of one physical page may be connected with one sub wordline. Sub wordlines of physical pages located at the same height may be connected in common with one wordline. Below the term "wordline" may be used to indicate a wordline or a sub wordline and may be interpreted based on the context.

Figure 3:
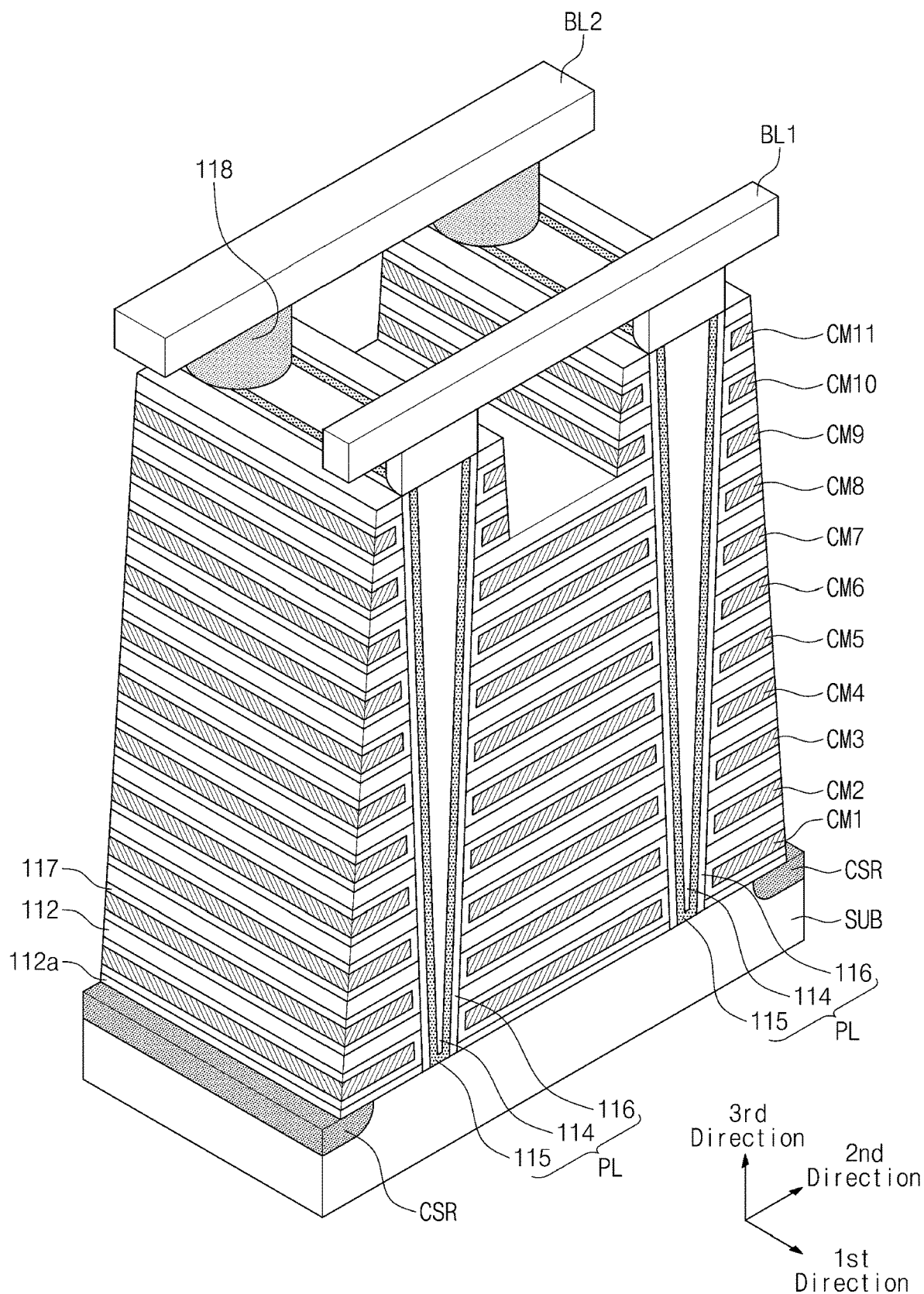
FIG. 3 is a perspective view of a partial structure of a memory block of FIG. 2.

FIG. 3 is a perspective view of a partial structure of the memory block BLKa of FIG. 2. Referring to FIGS. 1, 2, and 3, common source regions CSR that extend along the first direction and are spaced from each other along the second direction are provided on the substrate SUB.

The common source regions CSR may be connected in common to form the common source line CSL. In an embodiment, the substrate SUB may include a P-type semiconductor material. The common source regions CSR may include an N-type semiconductor material. For example, a conductive material for increasing conductivity of the common source line CSL may be disposed on the common source region CSR.

Between the common source regions CSR, insulating layers 112 and 112a are sequentially stacked on the substrate SUB along the third direction perpendicular to the substrate SUB. The insulating layers 112 and 112a may be spaced from each other along the third direction. In an embodiment, the insulating layers 112 and 112a may include silicon oxide or silicon nitride. In an embodiment, the thickness of the insulating layer 112a (e.g., a thicknesses of the insulating layer 112a in the third direction), which is in contact with the substrate SUB, from among the insulating layers 112 and 112a may be thinner than the thicknesses of each of the remaining insulating layers 112 (e.g., a thickness of each insulating layer in the third direction).

Pillars PL that are disposed to be spaced from each other along the first direction and the second direction and penetrate the insulating layers 112 and 112a along the third direction are provided between the common source regions CSR. In an embodiment, the pillars PL may be in contact with the substrate SUB through the insulating layers 112 and 112a. Each of the pillars PL may include an inner material 114, a channel layer 115, and a first insulating layer 116.

The inner material 114 may include an insulating material or an air gap. The channel layer 115 may include a P-type semiconductor material or an intrinsic semiconductor material. The first insulating layer 116 may include one or more insulating layers (e.g., different insulating layers) such as a silicon oxide layer, a silicon nitride layer, and an aluminum oxide layer.

Between the common source regions CSR, second insulating layers 117 are provided on upper surfaces and lower surfaces of the insulating layers 112 and 112a and on exposed outer surfaces of the pillars PL. The second insulating layer 117 provided on an upper surface of the uppermost insulating layer among the insulating layers 112 and 112a may be removed or omitted.

In each of the pillars PL, the first insulating layer 116 and the second insulating layer 117 may form an information storage layer when coupled adjacent to each other. For example, the first insulating layer 116 and the second insulating layer 117 may include oxide-nitride-oxide (ONO) or oxide-nitride-alumina (ONA). The first insulating layer 116 and the second insulating layer 117 may form a tunneling insulating layer, a charge trap layer, and a blocking insulating layer.

Between the common source regions CSR and between the insulating layers 112 and 112a, conductive materials CM1 to CM11 are provided on exposed outer surfaces of the second insulating layers 117. The conductive materials CM1 to CM11 may include a metallic conductive material. Drains 118 are provided on the pillars PL. In an embodiment, the drains 118 may include an N-type semiconductor material (e.g., silicon). In an embodiment, the drains 118 may be in contact with upper surfaces of the channel layers 115 of the pillars PL.

The first and second bitlines BL1 and BL2 that extends along the second direction and are spaced from each other along the first direction are provided on the drains 118. The first and second bitlines BL1 and BL2 are connected with the drains 118. In an embodiment, the drains 118 and the first and second bitlines BL1 and BL2 may be connected through contact plugs. The first and second bitlines BL1 and BL2 may include metallic conductive materials.

The pillars PL form the cell strings CS11, CS12, CS21, and CS22 together with the first and second insulating layers 116 and 117 and the conductive materials CM1 to CM11. Each of the pillars PL forms a cell string together with the first and second insulating layers 116 and 117 and the conductive materials CM1 to CM11, which are adjacent thereto. The first conductive material CM1 may form the ground selection transistors GST together with the first and second insulating layers 116 and 117 and the channel layers 115 adjacent thereto. The first conductive material CM1 may extend along the first direction to form the ground selection line GSL.

The second to ninth conductive materials CM2 to CM9 may respectively form first to eighth memory cells MC1 to MC8 together with the first and second insulating layers 116 and 117 and the channel layers 115, which are adjacent thereto. The second to ninth conductive materials CM2 to CM9 may extend along the first direction to form the first to eighth wordlines WL1 to WL8, respectively.

The tenth conductive materials CM10 may form the string selection transistors SSTa together with the first and second insulating layers 116 and 117 and the channel layers 115, which are adjacent thereto. The tenth conductive materials CM10 may extend along the first direction to form the string selection lines SSL1a and SSL2a.

The eleventh conductive materials CM11 may form the string selection transistors SSTb together with the first and second insulating layers 116 and 117 and the channel layers 115, which are adjacent thereto. The eleventh conductive materials CM11 may extend along the first direction to form the string selection lines SSL1b and SSL2b.

As the first to eleventh conductive materials CM1 to CM11 are stacked along the third direction, in each cell string, the ground selection transistor GST, the memory cells MC1 to MC8, and the string selection transistors SSTa and SSTb may be stacked along the third direction.

As the channel layer 115 is shared by the first to eleventh conductive materials CM1 to CM11 in each of the pillars PL, in each cell string, the ground selection transistor GST, the memory cells MC1 to MC8, and the string selection transistors SSTa and SSTb may be serially connected along the third direction. For example, the shared channel layer 115 may form a vertical body.

As the first to ninth conductive materials CM1 to CM9 are connected in common, each of the ground selection line GSL and the first to eighth wordlines WL1 to WL8 may be regarded as being connected in common with the cell strings CS11, CS12, CS21, and CS22.

The memory block BLKa is provided on a three-dimensional (3D) memory array. The 3D memory array is monolithically formed in one or more physical levels of arrays of memory cells MC having an active area disposed above a silicon substrate and a circuitry associated with the operation of those memory cells MC. The circuitry associated with the operation of the memory cells MC may be located above or within a substrate. The term "monolithic" means that layers of each level of the array are directly deposited on the layers of each underlying level of the 3D memory array.

In an embodiment of the present disclosure, the 3D memory array includes vertical cell strings CS11, CS12, CS21, and CS22 (or NAND strings) that are vertically oriented such that at least one memory cell is located over another memory cell. The at least one memory cell may include a charge trap layer. Each cell string further includes at least one selection transistor placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with wordlines and/or bitlines shared between levels: U.S. Pat. Nos. 7,679,133; 8,553,466; 8,654,587; 8,559,235; and US Pat. Pub. No. 2011/0233648.

In FIGS. 2 and 3, the common source region CSR is described as being formed at a portion of the substrate SUB. However, the common source region CSR may be implemented in the form of a plate covering the substrate SUB.

Figure 4:
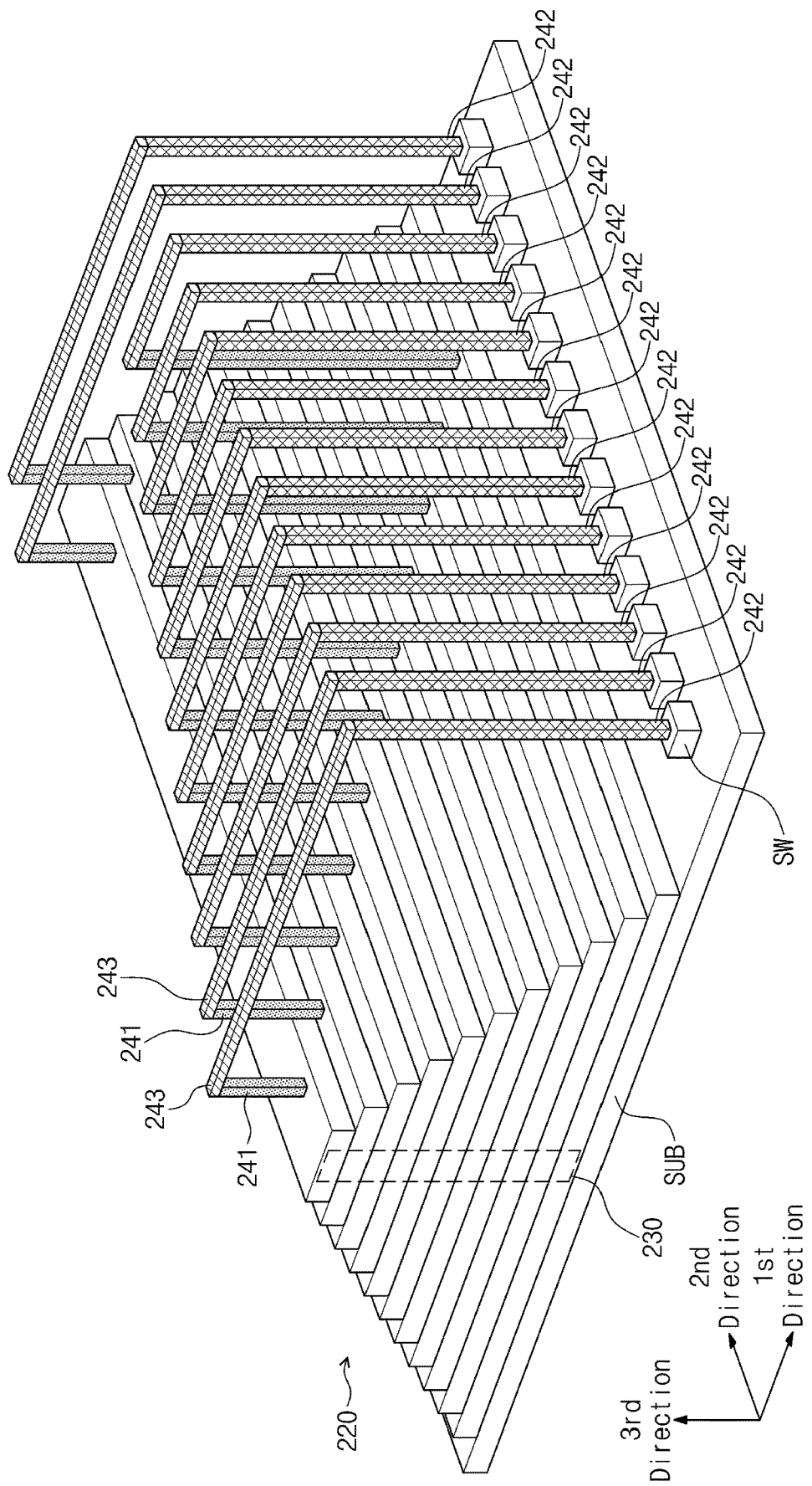
FIG. 4 illustrates an example of a physical structure in which a memory cell array is connected with a row decoder circuit or a sub decoder circuit.

FIG. 4 illustrates an example of a physical structure in which the memory cell array 110 is connected with the row decoder circuit 120 or the sub decoder circuit 125. Referring to FIGS. 1, 2, 3, and 4, a cell structure 220 of a stair shape may be disposed on the substrate SUB. The cell structure 220 may include a plurality of layers. The plurality of layers may include upper surfaces (e.g., upper surfaces in the third direction), the areas of which decrease as a distance from the substrate SUB increases. In an embodiment, an example of the cell structure 220 includes 11 layers is illustrated in FIG. 4.

The cell structure 220 may include a channel area 230. The channel area 230 may be located on the center of the cell structure 220 (e.g., the center of the cell structure 220 in the first direction). The channel area 230 may be common to the plurality of layers of the cell structure 220. In the channel area 230, the memory block BLKa may be implemented. In the channel area 230, each of the 11 layers may include a lower insulating layer capable of being implemented with the insulating layer 112/112a, and an upper conductive layer capable of being implemented with one of the conductive materials CM1 to CM11.

The plurality of layers of the cell structure 220 may be connected with the row decoder circuit 120 and the sub decoder circuit 125 through wires (or interconnections). The wires may include first vias 241, second vias 242, and conductive materials 243. The first vias 241 may respectively extend from the plurality of layers (e.g., the upper conductive layers) of the cell structure 220 in the third direction. The second vias 242 may extend along the third direction and may be connected with switching elements SW of the row decoder circuit 120 or the sub decoder circuit 125.

The conductive materials 243 may electrically connect the first vias 241 and the second vias 242, respectively. The conductive materials 243 may be implemented with metal wires disposed in a metal wire layer. In an embodiment, in the cell structure 220, an uppermost layer and a second uppermost layer may be connected with two wires.

In an embodiment, the first vias 241, the second vias 242, and the conductive materials 243 may be additionally implemented in a direction that faces away from the first direction. The first vias 241, the second vias 242, and the conductive materials 243 that face in the first direction with respect to the channel area 230 may be connected with one of the row decoder circuit 120 and the sub decoder circuit 125. The first vias 241, the second vias 242, and the conductive materials 243 that face in the direction facing away from the first direction with respect to the channel area 230 may be connected with the other of the row decoder circuit 120 and the sub decoder circuit 125.

As described with reference to FIG. 4, the 11 layers (e.g., the upper conductive layers) of the cell structure 220 are connected with the row decoder circuit 120 and the sub decoder circuit 125 through the first vias 241 and the second vias 242. At least one of the first vias 241 or the second vias 242 may be broken in the process of manufacturing the first vias 241 or the second vias 242. In the case where at least one of the first vias 241 or the second vias 242 is broken, the row decoder circuit 120 or the sub decoder circuit 125 fails to supply a voltage to the corresponding ground selection line, wordline, or string selection line.

Alternatively, in the process of manufacturing the first vias 241 or the second vias 242, a width of at least one of the first vias 241 or the second vias 242 may be formed to smaller than a normal width, or impurities may be included in at least one of the first vias 241 or the second vias 242; in this case, an abnormal region may be formed therein. As the nonvolatile memory device 100 is used and degraded, the abnormal region of the at least one of the first vias 241 or the second vias 242 may be broken. In the case where at least one of the first vias 241 or the second vias 242 is broken, the row decoder circuit 120 or the sub decoder circuit 125 fails to supply a voltage to the corresponding ground selection line, wordline, or string selection line.

In the case where at least one of the row decoder circuit 120 and the sub decoder circuit 125 fails to supply a voltage to a wordline, the wordline may not be driven with a target voltage (e.g., a target voltage for the program, read, or erase operation). Accordingly, the reliability of memory cells connected with the wordline may not be secured.

Figure 5:
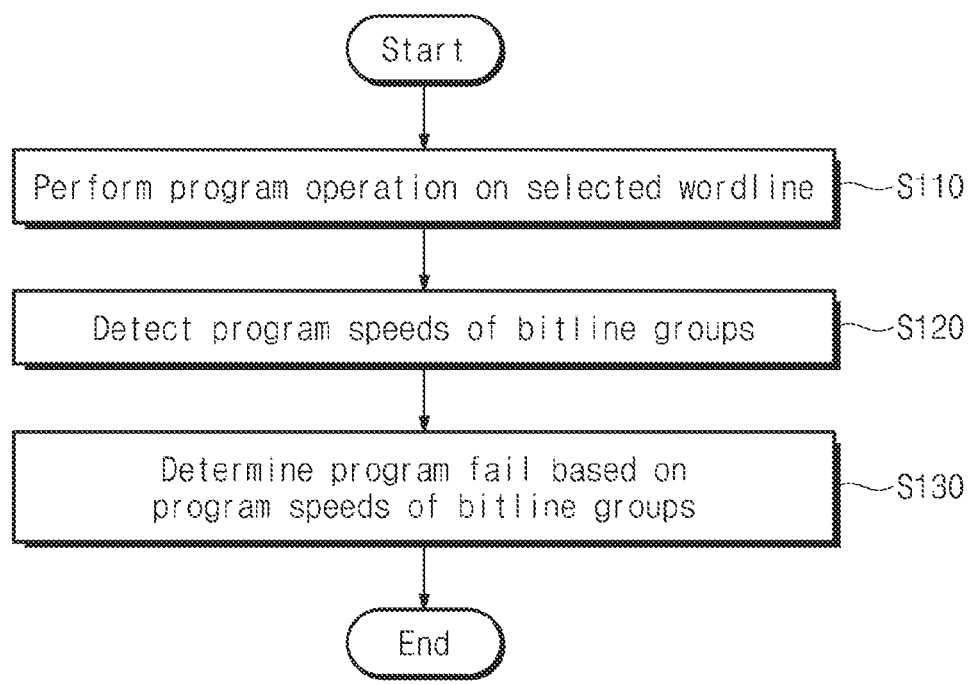
FIG. 5 illustrates an operating method of a nonvolatile memory device according to an embodiment of the present disclosure.

FIG. 5 illustrates an operating method of the nonvolatile memory device 100 according to an embodiment of the present disclosure. Referring to FIGS. 1 and 5, in operation S110, the nonvolatile memory device 100 performs a program operation on a selected wordline. For example, the nonvolatile memory device 100 may select a wordline based on the row address RA of the address ADDR received from the external device.

The nonvolatile memory device 100 may perform the program operation in response to that a program command or a test program command is received from the external device as the command CMD. When the nonvolatile memory device 100 receives the program command as the command CMD, data for the program operation may be received together. When the nonvolatile memory device 100 receives the test program command as the command CMD, the nonvolatile memory device 100 may not receive data, may receive dummy data not associated with a test program operation, or may receive test data for the test program operation.

The page buffer circuit 130 may apply voltages to the bitlines of the first to n-th bitline groups BG1 to BGn, based on the data or the test data (e.g., may precharge or bias the bitlines thereof based on the data or the test data). The test data may be received from the external device or may be internally generated.

In operation S120, the nonvolatile memory device 100 detects program speeds of the first to n-th bitline groups BG1 to BGn. For example, the pass/fail check circuit 140 of the nonvolatile memory device 100 may detect a program speed of memory cells of a specific bitline group while the program operation is performed on the memory cells of the specific bitline group or after the program operation has completed.

In operation S130, the pass/fail check circuit 140 or the control logic circuit 170 of the nonvolatile memory device 100 may determine a program fail based on the program speeds of the first to n-th bitline groups BG1 to BGn.

In an embodiment, when a specific wordline is electrically connected with the row decoder circuit 120 or is electrically disconnected from the sub decoder circuit 125, a program speed of memory cells adjacent to the row decoder circuit 120 from among memory cells of the specific wordline may be higher than a program speed of memory cells adjacent to the sub decoder circuit 125 from among the memory cells of the specific wordline.

In contrast, when the specific wordline is electrically disconnected from the row decoder circuit 120 or is electrically connected with the sub decoder circuit 125, the program speed of the memory cells adjacent to the row decoder circuit 120 from among the memory cells of the specific wordline may be lower than the program speed of the memory cells adjacent to the sub decoder circuit 125 from among the memory cells of the specific wordline.

When a difference between program speeds according to physical locations of the memory cells connected with the specific wordline (e.g., according to a location between the row decoder circuit 120 and the sub decoder circuit 125) is greater than a first threshold value, one of the row decoder circuit 120 and the sub decoder circuit 125 may be regarded as being disconnected with the specific wordline. Accordingly, even though the program pass is determined by the first to n-th sub check circuits 141 to 14n, when a program speed difference is greater than the first threshold value, the pass/fail check circuit 140 or the control logic circuit 170 may determine the program fail.

The control logic circuit 170 may prevent data from being written in the memory cells connected with the selected wordline, by outputting a program status fail (PSF) signal as the control signal CTRL.

Figure 6:
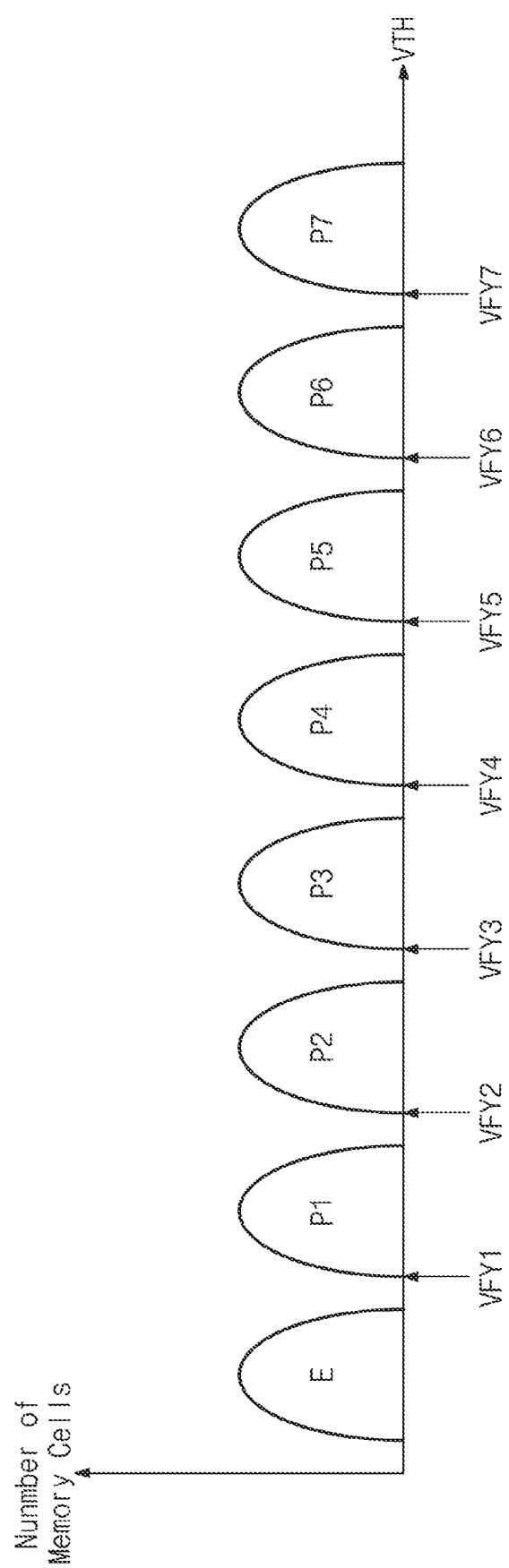
FIG. 6 illustrates an example in which a nonvolatile memory device performs a program operation in response to a program command.

FIG. 6 illustrates an example in which the nonvolatile memory device 100 performs a program operation in response to a program command. In FIG. 6, a horizontal axis represents a threshold voltage VTH of a memory cell, and a vertical axis represents the number of memory cells.

Referring to FIGS. 1, 2, and 6, the nonvolatile memory device 100 may program memory cells of an erase state "E" to first to seventh program states P1 to P7. The nonvolatile memory device 100 may program the memory cells to the first to seventh program states P1 to P7 by using first to seventh verification voltages VFY1 to VFY7.

In the program operation, each memory cell may maintain the erase state "E" or may be programmed to have a threshold voltage included in one of the first to seventh program states P1 to P7. A program state may indicate a range of threshold voltages of memory cells. For example, memory cells to be programmed to the first program state P1 may be programmed to have a threshold voltage included in a threshold voltage range marked by the first program state P1. Likewise, memory cells to be programmed to the second to seventh program states P2 to P7 may be programmed to have threshold voltages included in threshold voltage ranges marked by the second to seventh program states P2 to P7.

Figure 7:
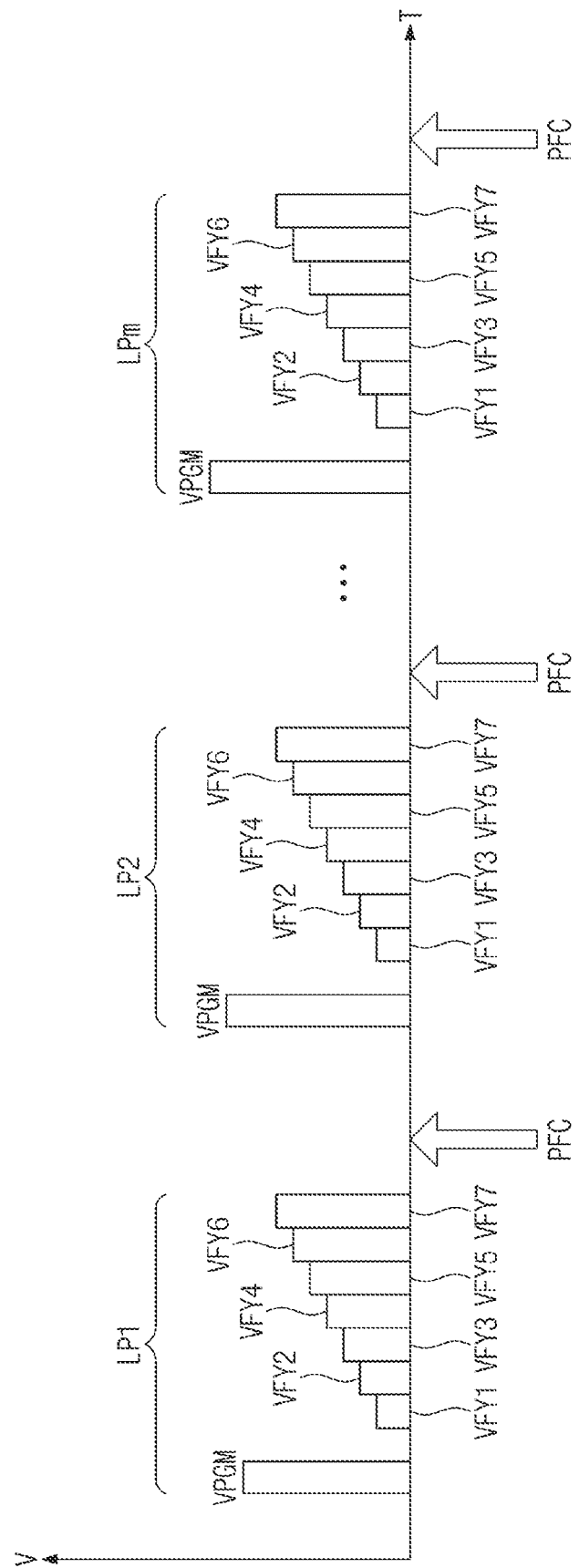
FIG. 7 illustrates an example in which a nonvolatile memory device performs program loops of a program operation in response to a program command.

FIG. 7 illustrates an example in which the nonvolatile memory device 100 performs program loops of a program operation in response to a program command. In FIG. 7, a horizontal axis represents a time "T", and a vertical axis represents a voltage "V" applied to a selected wordline.

Referring to FIGS. 1, 6, and 7, in the program operation, the nonvolatile memory device 100 may perform first to m-th program loops LP1 to LPm (m being a positive integer). For example, the nonvolatile memory device 100 may perform the first to m-th program loops LP1 to LPm until the program pass is determined by the first to n-th sub check circuits 141 to 14n or as much as a given maximum program count.

Each of the first to m-th program loops LP1 to LPm may include a program step of applying a program voltage VPGM and a verify step of applying first to seventh verification voltages VFY1 to VFY7. Threshold voltages of memory cells of a selected wordline (e.g., selected sub wordline) may increase by applying the program voltage VPGM. The verify read operation may be performed by applying the first to seventh verification voltages VFY1 to VFY7. The nonvolatile memory device 100 may determine whether each of the memory cells is programmed to a target program state of the first to seventh program states P1 to P7, by performing a pass/fail check (PFC) operation on results of the verify read operation stored in the page buffer circuit 130.

For example, when a threshold voltage of a memory cell to be programmed to the first program state P1 is smaller than the first verification voltage VFY1, the corresponding memory cell may be determined as the program fail. When the threshold voltage of the memory cell to be programmed to the first program state P1 is greater than the first verification voltage VFY1, the corresponding memory cell may be program-inhibited. Likewise, the nonvolatile memory device 100 may program the memory cells to the second to seventh program states P2 to P7 by using the second to seventh verification voltages VFY2 to VFY7.

As a program loop progresses (or is repeated), a level of the program voltage VPGM may increase. In initial program loops such as the first program loop LP1, some of the first to seventh verification voltages, for example, higher verification voltages such as the seventh verification voltage VFY7 may not be applied. As a program loop progresses (or is repeated), program states having lower threshold voltage ranges such as the first program state P1 may be program-passed prior to the remaining program states. A verification voltage (e.g., the first verification voltage VFY1) corresponding to the program-passed program state among the first to seventh verification voltages VFY1 to VFY7 may not be applied any longer.

Figure 8:
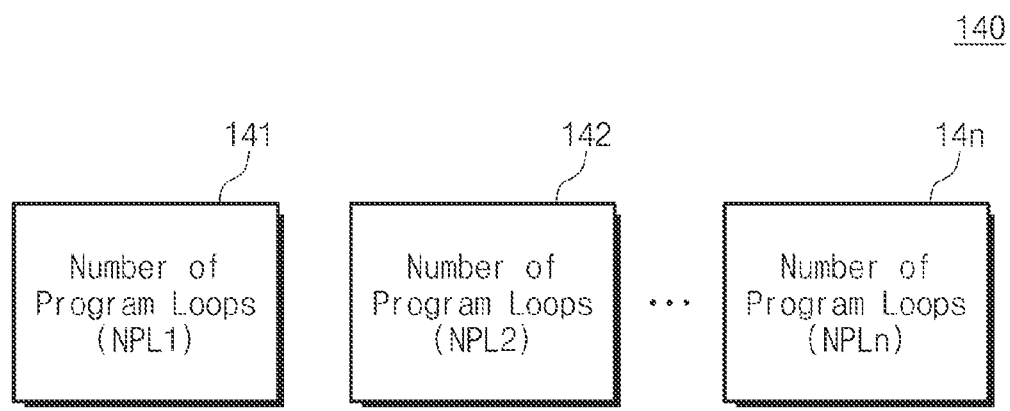
FIG. 8 illustrates a first example in which first to n-th sub check circuits detect program speeds.

FIG. 8 illustrates a first example in which the first to n-th sub check circuits 141 to 14n detect program speeds. Referring to FIGS. 1, 2, and 8, each of the first to n-th sub check circuits 141 to 14n may detect, as a program speed, the number of program loops performed until programming has completed (refer to NPL1 to NPLn of FIG. 8).

For example, the first sub check circuit 141 may count the number NPL1 of program loops performed until memory cells corresponding to the first bitline group BG1 from among memory cells connected with a selected wordline (or a selected sub wordline) are completely programmed (or are program-passed). The second sub check circuit 142 may count the number NPL2 of program loops performed until memory cells corresponding to the second bitline group BG2 from among the memory cells connected with the selected wordline (or the selected sub wordline) are completely programmed (or are program-passed).

Likewise, the n-th sub check circuit 14n may count the number NPLn of program loops performed until memory cells corresponding to the n-th bitline group BGn from among the memory cells connected with the selected wordline (or the selected sub wordline) are completely programmed (or are program-passed).

In an embodiment, programming of a program state (e.g., the seventh program state P7) corresponding to a threshold voltage range higher than the remaining program states may be completed last (or may be passed latest). In the case where a decoding algorithm such as randomizing is used, the number of memory cells to be programmed to the seventh program state P7 from among memory cells corresponding to the first bitline group BG1, the number of memory cells to be programmed to the seventh program state P7 from among memory cells corresponding to the second bitline group BG2, and the number of memory cells to be programmed to the seventh program state P7 from among memory cells corresponding to the n-th bitline group BGn may be similar to each other.

When a difference between points in time when memory cells are completely programmed is smaller than or equal to the first threshold value, that is, when a difference between program speeds at which the memory cells are programmed is smaller than or equal to the first threshold value, the selected wordline may be regarded as being electrically connected to the row decoder circuit 120 and the sub decoder circuit 125. When the difference between the points in time when the memory cells are completely programmed is greater than the first threshold value, that is, when the difference between the program speeds at which the memory cells are programmed is greater than the first threshold value, the selected wordline may be regarded as being electrically disconnected from one of the row decoder circuit 120 and the sub decoder circuit 125.

Figure 9:
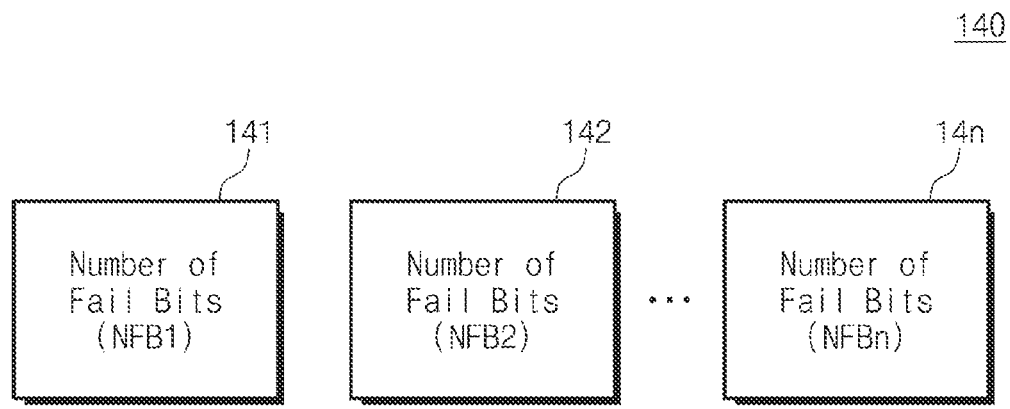
FIG. 9 illustrates a second example in which first to n-th sub check circuits detect program speeds.

FIG. 9 illustrates a second example in which the first to n-th sub check circuits 141 to 14n detect program speeds.

Referring to FIGS. 1, 2, and 9, each of the first to n-th sub check circuits 141 to 14n may detect, as a program speed, the number of fail bits (refer to NFB1 to NFBn of FIG. 9) after a designated program loop is performed.

For example, the first sub check circuit 141 may count the number NFB1 of fail bits after the k-th program loop (k being a positive integer of m or less) is performed on memory cells corresponding to a selected wordline (or a selected sub wordline) and the first bitline group BG1. The second sub check circuit 142 may count the number NFB2 of fail bits after the k-th program loop is performed on memory cells corresponding to the selected wordline (or the selected sub wordline) and the second bitline group BG2.

The n-th sub check circuit 14n may count the number NFBn of fail bits after the k-th program loop is performed on memory cells corresponding to the selected wordline (or the selected sub wordline) and the n-th bitline group BGn.

In an embodiment, the first to n-th sub check circuits 141 to 14n may count the number of fail bits from memory cells that are programmed to the highest program state (e.g., the seventh program state P7). As the number of fail bits increases, a program speed may be regarded as becoming slower. As the number of fail bits decreases, a program speed may be regarded as becoming faster. For example, if a memory cell was just programmed to a seventh program state P7 but is then determined to have a threshold voltage corresponding to a sixth program state P6, one fail bit would be associated with the memory cell.

In the case where a decoding algorithm such as randomizing is used, the number of memory cells to be programmed to the seventh program state P7 from among memory cells corresponding to the first bitline group BG1, the number of memory cells to be programmed to the seventh program state P7 from among memory cells corresponding to the second bitline group BG2, and the number of memory cells to be programmed to the seventh program state P7 from among memory cells corresponding to the n-th bitline group BGn may be similar to each other.

When a difference between program speeds of the memory cells is smaller than or equal to the first threshold value, the selected wordline may be regarded as being electrically connected to the row decoder circuit 120 and the sub decoder circuit 125. When the difference between the program speeds of the memory cells is greater than the first threshold value, the selected wordline may be regarded as being electrically disconnected from one of the row decoder circuit 120 and the sub decoder circuit 125.

Figure 10:
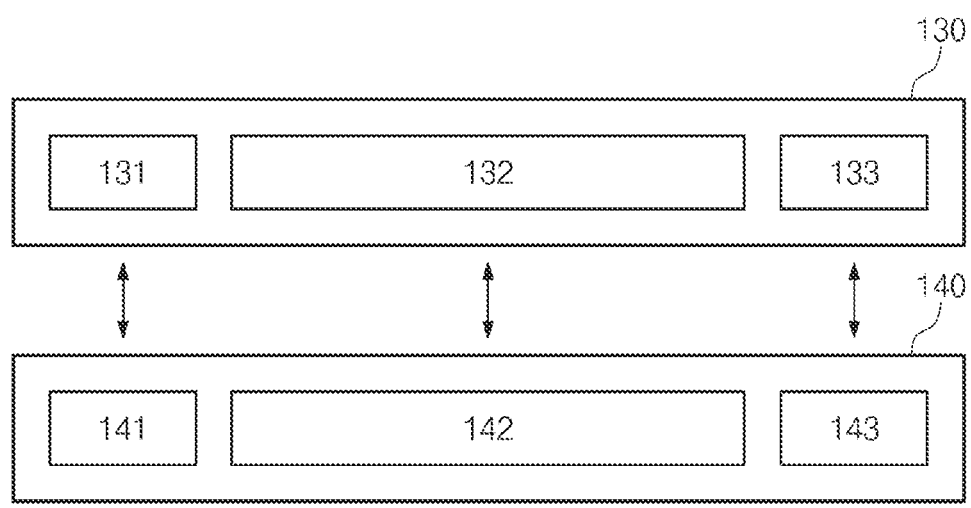
FIG. 10 is an example of a physical ratio of a page buffer circuit and a pass/fail check circuit.

FIG. 10 is an example of a physical ratio of the page buffer circuit 130 and the pass/fail check circuit 140. Referring to FIGS. 1, 2, and 10, the first page buffer 131 may be connected with memory cells adjacent to the row decoder circuit 120 from among memory cells of the memory cell array 110. The first sub check circuit 141 may operate in conjunction with the first page buffer 131. The first sub check circuit 141 may provide information that is used to determine whether a wordline(s) is electrically connected with or disconnected from the row decoder circuit 120, by detecting a program speed of memory cells adjacent to the row decoder circuit 120.

The third page buffer 133 may be connected with memory cells adjacent to the sub decoder circuit 125 from among the memory cells of the memory cell array 110. The third sub check circuit 143 may operate in conjunction with the third page buffer 133. The third sub check circuit 143 may provide information that is used to determine whether a wordline(s) is electrically connected with or disconnected from the sub decoder circuit 125, by detecting a program speed of memory cells adjacent to the sub decoder circuit 125.

The second page buffer 132 may be connected with memory cells between the first page buffer 131 and the third page buffer 133. The second sub check circuit 142 may operate in conjunction with the second page buffer 132.

The nonvolatile memory device 100 may determine the program fail by comparing the program speed detected by the first sub check circuit 141 and the program speed detected by the second sub check circuit 142.

In an embodiment, the nonvolatile memory device 100 may be configured to determine the program fail by comparing the program speed with a given reference value. For example, in the case where a resistance component between the row decoder circuit 120, the sub decoder circuit 125, and a specific wordline increases, program speeds of memory cells connected with the specific wordline may overall decrease.

Alternatively, in the case where a resistance component between the row decoder circuit 120, the sub decoder circuit 125, and a specific wordline increases, the influence of an adjacent wordline on the specific wordline may increase. In this case, the program speeds of the memory cells connected with the specific wordline may overall decrease.

The nonvolatile memory device 100 may store reference values indicating average program speeds according to environment information of the nonvolatile memory device 100, such as the number of program/erase cycles (or a program/erase count) or a temperature profile including a temperature change, in the form of a table. Alternatively, the nonvolatile memory device 100 may store, as reference values, program speeds of memory cells that belong to the same memory block and are connected with different wordlines.

The nonvolatile memory device 100 may compare the program speed(s) detected by the first sub check circuit 141, the second sub check circuit 142, and/or the third sub check circuit 143 with the reference values. When a difference between the detected program speed(s) and a reference value is greater than a second threshold value (being equal to or different from the first threshold value), the nonvolatile memory device 100 may determine the program fail.

Figure 11:
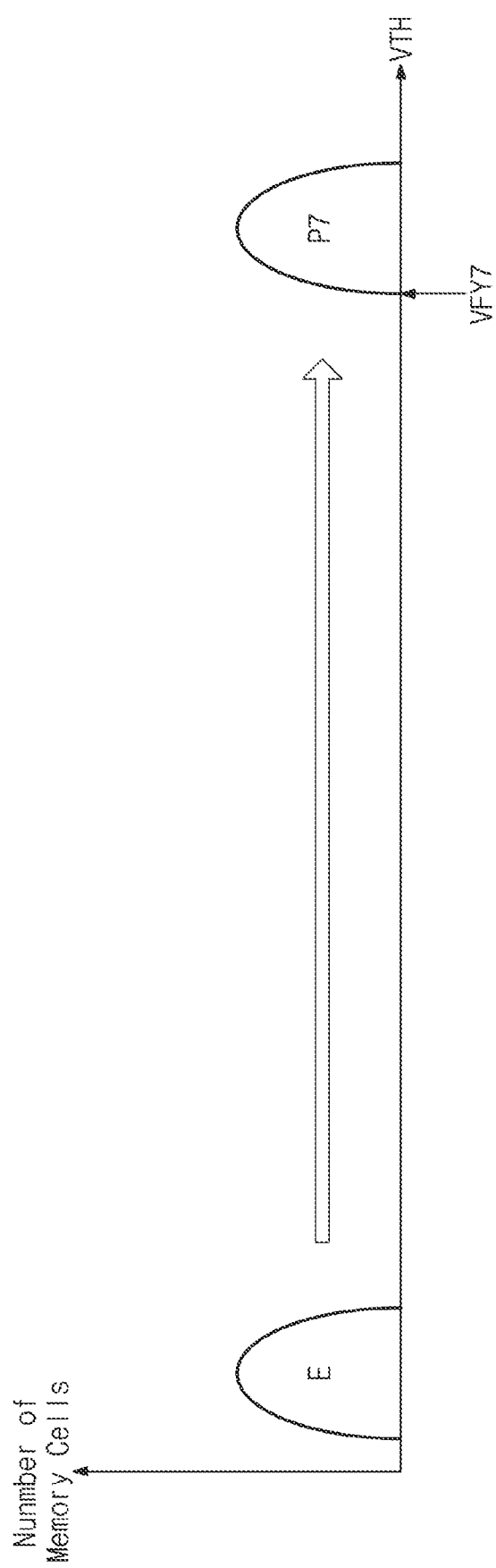
FIG. 11 illustrates an example in which a nonvolatile memory device performs a program operation in response to a test program command.

FIG. 11 illustrates an example in which the nonvolatile memory device 100 performs a program operation in response to a test program command. In FIG. 11, a horizontal axis represents a threshold voltage VTH of a memory cell, and a vertical axis represents the number of memory cells. The test program command may be sent periodically by a memory controller.

Referring to FIGS. 1, 2, and 11, the nonvolatile memory device 100 may program memory cells of the erase state "E" to at least one program state to detect program speeds, for example, the seventh program state P7. The nonvolatile memory device 100 may program the memory cells to the seventh program state P7 by using the seventh verification voltage VFY7. Test data for the test program operation may be received from the external device or may be internally generated.

Figure 12:
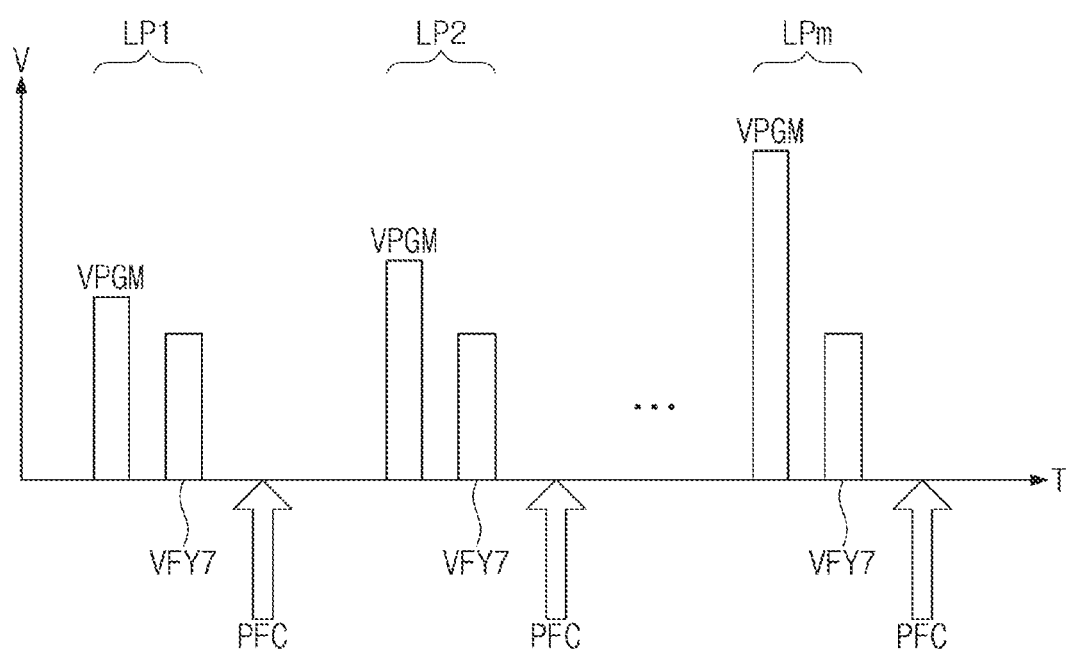
FIG. 12 illustrates an example in which a nonvolatile memory device performs program loops of a program operation in response to a test program command.

FIG. 12 illustrates an example in which the nonvolatile memory device 100 performs program loops of a program operation in response to a test program command. In FIG. 12, a horizontal axis represents a time "T", and a vertical axis represents a voltage "V" applied to a selected wordline.

Referring to FIGS. 1, 11, and 12, in the test program operation, the nonvolatile memory device 100 may perform the first to m-th program loops LP1 to LPm (m being a positive integer). For example, the nonvolatile memory device 100 may perform the first to m-th program loops LP1 to LPm until the program pass is determined by the first to n-th sub check circuits 141 to 14n or as much as a given maximum program count.

Each of the first to m-th program loops LP1 to LPm may include a program step of applying a program voltage VPGM and a verify step of applying the seventh verification voltage VFY7. Threshold voltages of memory cells of a selected wordline (e.g., selected sub wordline) may increase by applying the program voltage VPGM. The verify read operation may be performed by applying the seventh verification voltage VFY7. The nonvolatile memory device 100 may determine whether each of the memory cells is programmed to the seventh program state P7, by performing a pass/fail check (PFC) operation on results of the verify read operation stored in the page buffer circuit 130.

For example, when a threshold voltage of a memory cell is smaller than the seventh verification voltage VFY7, the corresponding memory cell may be determined as the program fail. When the threshold voltage of the memory cell is greater than the seventh verification voltage VFY7, the corresponding memory cell may be determined as the program pass. As a program loop progresses (or is repeated), a level of the program voltage VPGM may increase.

In an embodiment, the test program operation may be performed to be different from the program operation. The test program operation may be performed by using voltages that are easier to detect program speeds. For example, an initial level of the program voltage VPGM of the test program operation may be higher than an initial level of the program voltage VPGM of the program operation. The increment of the program voltage VPGM of the test program operation (e.g., the degree by which the program voltage VPGM increases when the program loops progress) may be greater than the increment of the program voltage VPGM of the program operation.

In an embodiment, test data for the test program operation may vary depending on a location of memory cells, for example, a location of memory cells between the row decoder circuit 120 and the sub decoder circuit 125. Through the first page buffer 131 described with reference to FIG. 10, test data corresponding to the highest program state for detecting a program speed may be programmed in memory cells adjacent to the row decoder circuit 120.

Through the third page buffer 133 described with reference to FIG. 10, test data corresponding to the highest program state for detecting a program speed may be programmed in memory cells adjacent to the sub decoder circuit 125. Through the second page buffer 132 described with reference to FIG. 10, test data corresponding to the highest program state for detecting a program speed, or test data corresponding to an intermediate program state or erase state for reducing the stress may be programmed in memory cells that are not adjacent to the row decoder circuit 120 and are not adjacent to the sub decoder circuit 125.

In an embodiment, as described with reference to FIGS. 8 and 9, the first to n-th sub check circuits 141 to 14n of the pass/fail check circuit 140 may detect, as a program speed, the number of program loops performed until memory cells are completely programmed, or the number of fail bits detected after the k-th program loop is performed.

Figure 13:
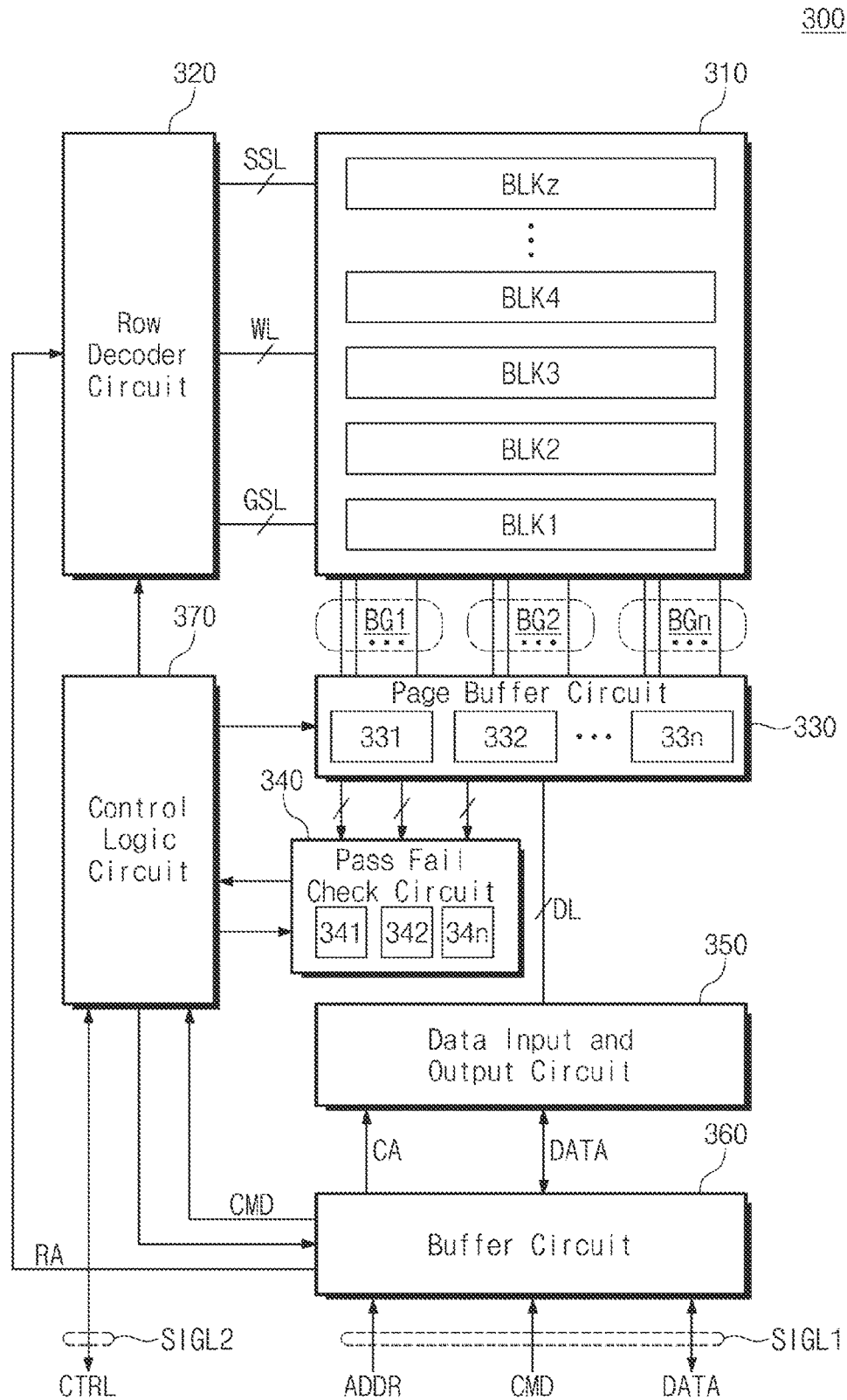
FIG. 13 is a block diagram illustrating a nonvolatile memory device according to an embodiment of the present disclosure.

FIG. 13 is a block diagram illustrating a nonvolatile memory device 300 according to an embodiment of the present disclosure. Referring to FIG. 13, the nonvolatile memory device 300 includes a memory cell array 310, a row decoder circuit 320, a page buffer circuit 330, a pass/fail check circuit (PFC) 340, a data input and output circuit 350, a buffer circuit 360, and a control logic circuit 370. Compared to the nonvolatile memory device 100 of FIG. 1, the nonvolatile memory device 300 does not include the sub decoder circuit 125. The page buffer circuit 330 may include first to n-th page buffers 331 to 33n.

As described with reference to FIGS. 1 to 12, the nonvolatile memory device 300 may compare program speeds detected by first to n-th sub check circuits 341 to 34n. When a difference between the program speeds is greater than a threshold value, the nonvolatile memory device 300 may determine the program fail.

For example, when a great resistance component is present on a wire (e.g., the first vias 241, the second vias 242, or the conductive materials 243) (refer to FIG. 4) connecting the row decoder circuit 120 with a specific wordline of the wordlines WL, the ability of the row decoder circuit 120 to drive a voltage to the specific wordline may decrease.

Accordingly, a difference may be present between a time taken for a voltage of a portion of the specific wordline, which is adjacent to the row decoder circuit 120, to reach a target level and a time taken for a voltage of a portion of the specific wordline, which is distant from the row decoder circuit 120, to reach the target level. That is, a difference may be present between program speeds of memory cells depending on a distance from the row decoder circuit 120. The nonvolatile memory device 300 may determine a program operation of memory cells connected with the specific wordline having the great resistance component as a fail by comparing the difference between the program speeds with a threshold value.

As another example, in the case where a resistance component between the row decoder circuit 120 and the specific wordline increases, the program speeds of the memory cells connected with the specific wordline may overall decrease. The nonvolatile memory device 300 may store reference values indicating average program speeds according to environment information of the nonvolatile memory device 300, such as the number of program/erase cycles (or a program/erase count) or a temperature profile including a temperature change, in the form of a table. Alternatively, the nonvolatile memory device 300 may store, as reference values, program speeds of memory cells that belong to the same memory block and are connected with different wordlines.

The nonvolatile memory device 300 may compare the program speed(s) detected by at least one of the first to n-th sub check circuits 341 to 34n with the reference values. When a difference between the detected program speed(s) and a reference value is greater than the second threshold value (being equal to or different from the first threshold value), the nonvolatile memory device 300 may determine the program fail.

Figure 14:
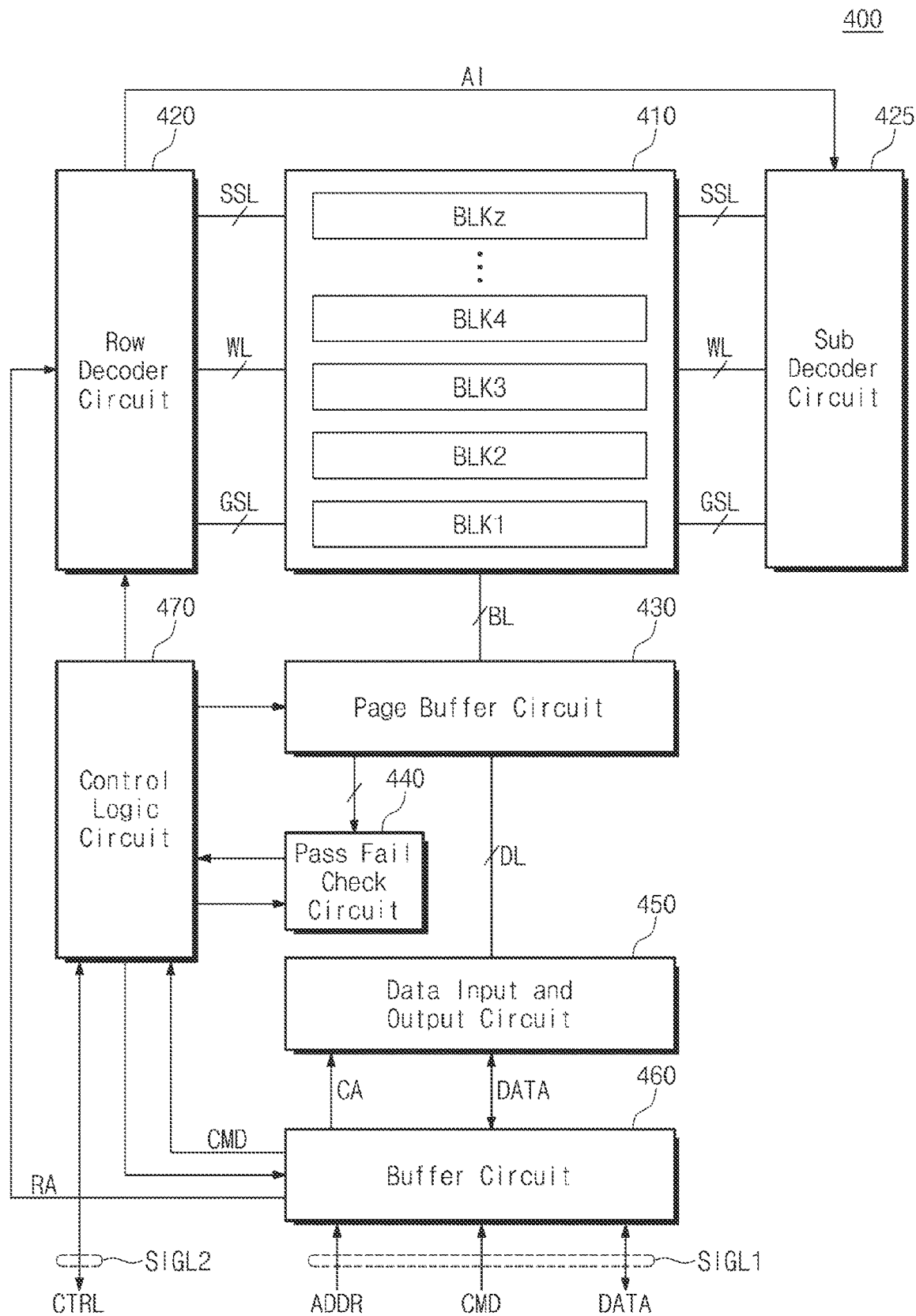
FIG. 14 is a block diagram illustrating a nonvolatile memory device according to an embodiment of the present disclosure.

FIG. 14 is a block diagram illustrating a nonvolatile memory device 400 according to a third embodiment of the present disclosure. Referring to FIG. 14, the nonvolatile memory device 400 includes a memory cell array 410, a row decoder circuit 420, a sub decoder circuit 425, a page buffer circuit 430, a pass/fail check circuit (PFC) 440, a data input and output circuit 450, a buffer circuit 460, and a control logic circuit 470.

Compared to FIG. 4, the pass/fail check circuit 440 may determine a pass or a fail with respect to the whole page buffer circuit 430. Accordingly, the division of page buffers according to locations is not illustrated within the page buffer circuit 430. Also, the division of the bitlines BL into bitline groups is not illustrated.

The pass/fail check circuit 440 may determine the pass or the fail from a result of a verify read operation (e.g., a program verify read operation or an erase verify read operation) stored in the page buffer circuit 430.

In the verify read operation associated with the program operation, the pass/fail check circuit 440 may determine the pass or the fail based on a result of the verify read operation sensed by the page buffer circuit 430, that is, a result of the verify read operation for memory cells connected with the bitlines BL. The pass/fail check circuit 440 may count the number of values (e.g., "0") corresponding to on-cells that are not programmed to have a threshold voltage greater than or equal to a target threshold voltage (or the number of values corresponding to fail bits).

In the verify read operation associated with the erase operation, the pass/fail check circuit 440 may determine the pass or the fail based on a result of the verify read operation sensed by the page buffer circuit 430, that is, a result of the verify read operation for memory cells connected with the bitlines BL. The pass/fail check circuit 440 may count the number of values (e.g., "1") corresponding to off-cells that are not erased to have a threshold voltage less than or equal to a target threshold voltage (or the number of values corresponding to fail bits).

When a counting result is greater than or equal to a third threshold value, the pass/fail check circuit 440 may output a signal indicating the fail to the control logic circuit 470. When the counting result is smaller than the third threshold value, the pass/fail check circuit 440 may output a signal indicating the pass to the control logic circuit 470.

In an embodiment, the pass/fail check circuit 440 may detect a program speed of memory cells. For example, to detect a program speed, the pass/fail check circuit 440 may count the number of times that a program loop is performed or may count the number of fail bits. The pass/fail check circuit 440 may detect program speeds at least two times in at least two test program operations (e.g., test program operations consecutive or separated on the time axis).

In an embodiment, the pass/fail check circuit 440 may determine the program fail of the test program operation based on the at least two program speeds thus detected. When the program fail is determined based on the program speeds, the pass/fail check circuit 440 may provide the control logic circuit 470 with a signal indicating the program fail.

As another example, the pass/fail check circuit 440 may provide the control logic circuit 470 with the at least two program speeds thus detected. The control logic circuit 470 may determine the program fail of the test program operation based on the at least two program speeds thus detected. For example, the logic circuit 470 may determine what a program fail of the test program operation has occurred based on the at least two program speeds.

Figure 15:
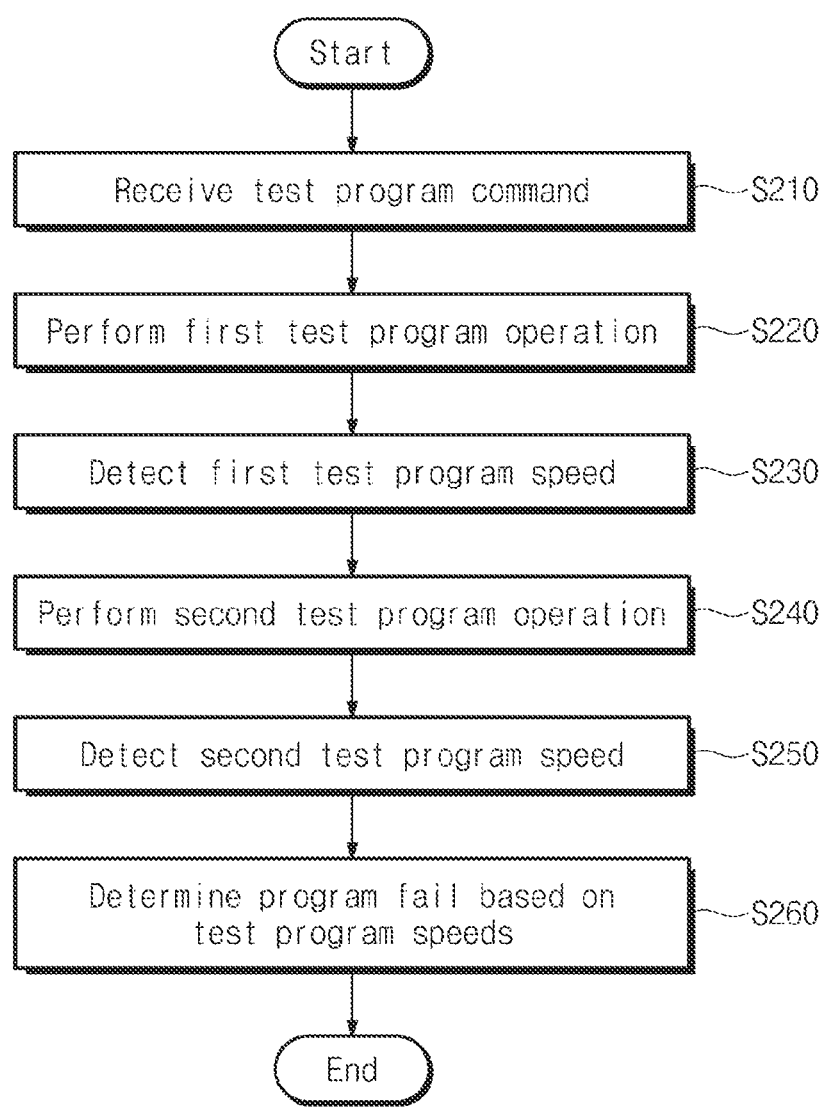
FIG. 15 illustrates an example of an operating method of a nonvolatile memory device of FIG. 14.

FIG. 15 illustrates an example of an operating method of the nonvolatile memory device 400 of FIG. 14 according to an embodiment of the disclosure. Referring to FIGS. 14 and 15, in operation S210, the nonvolatile memory device 400 receives the test program command as the command CMD from the external device. The nonvolatile memory device 400 may receive test data for a test program operation associated with the test program command from the external device or may internally generate the test data.

In operation S220, the nonvolatile memory device 400 performs a first test program operation. For example, the first test program operation may increase threshold voltages of memory cells near or adjacent the row decoder circuit 420. The first test program operation may be performed in response receiving the test program command. In operation S230, the nonvolatile memory device 400 detects a first test program speed of the first test program operation. In operation S240, the nonvolatile memory device 400 performs a second test program operation. For example, the second test program operation may increase threshold voltages of memory cells far or non-adjacent the row decoder circuit 420. The second test program operation may be performed in response receiving the test program command. In operation S250, the nonvolatile memory device 400 detects a second test program speed of the second test program operation.

In operation S260, the nonvolatile memory device 400 may determine the program fail of the test program operation based on the first and second test program speeds. For example, when a difference between the first and second program speeds is greater than a fourth threshold value, the nonvolatile memory device 400 may determine the program fail.

Figure 16:
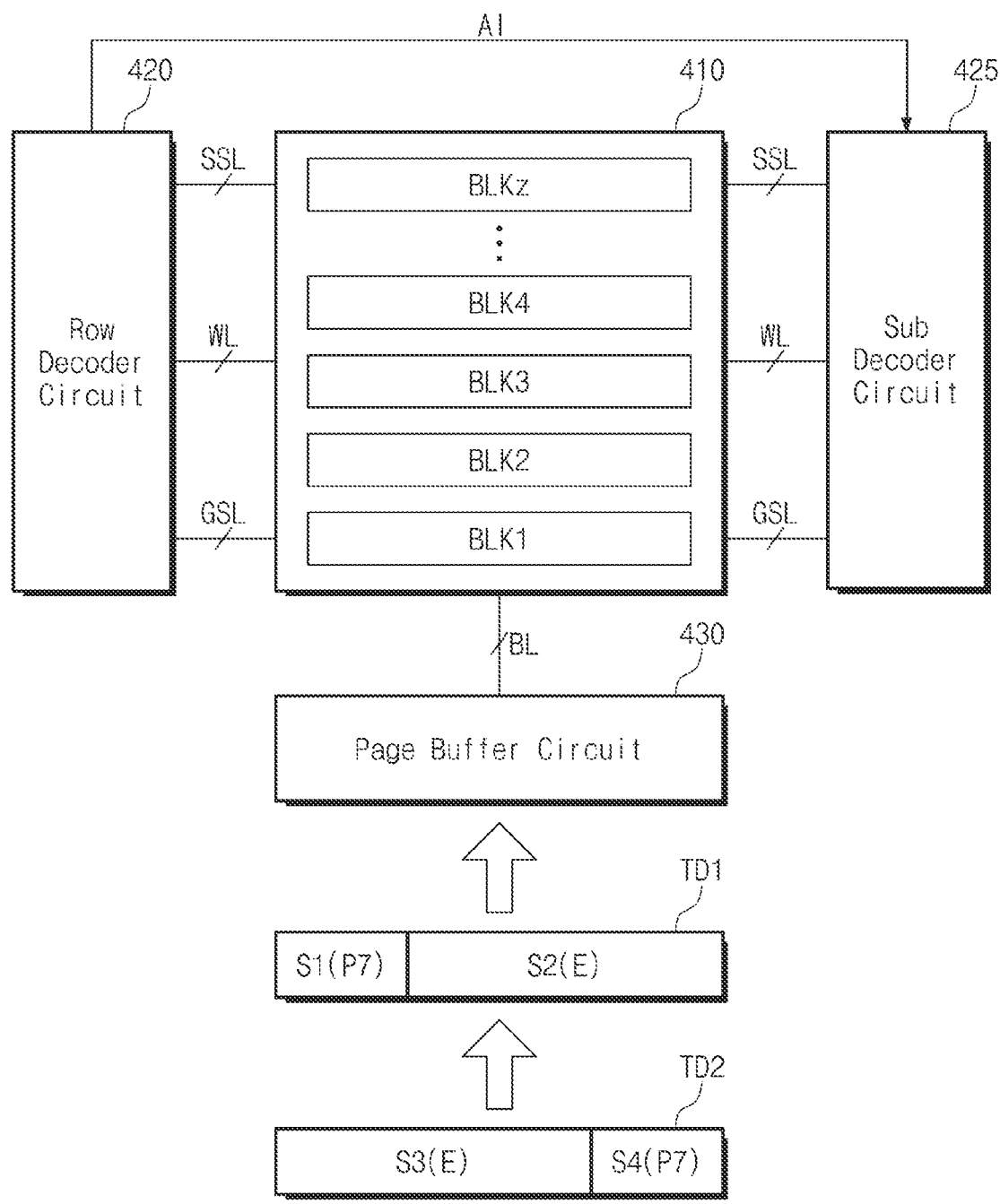
FIG. 16 illustrates an example in which test program operations are performed in a nonvolatile memory device.

FIG. 16 illustrates an example in which test program operations are performed in the nonvolatile memory device 400. Referring to FIGS. 14 and 16, first test data TD1 may be data for a first test program operation. The first test data TD1 may include a first segment S1 and a second segment S2.

In an embodiment, the first segment S1 is programmed in memory cells adjacent to the row decoder circuit 420, and the second segment S2 is programmed in other memory cells not adjacent to the row decoder circuit 420. The first segment S1 may be used to detect a program speed of the memory cells adjacent to the row decoder circuit 420. For example, the adjacent memory cells could be the memory cells connected to the bit lines of the first bit line group BG1 and the non-adjacent memory cells could be the memory cells connected to the bit lines of the n-th bit line group BGn.

For example, as described with reference to FIGS. 11 and 12, the first segment S1 may include data corresponding to the highest program state such as the seventh program state P7. The second segment S2 may include data corresponding to the erase state "E" or a program state(s) lower than the seventh program state P7.

The second test data TD2 may be data for a second test program operation. The second test data TD2 may include a third segment S3 and a fourth segment S4.

The fourth segment S4 may be programmed in memory cells adjacent to the sub decoder circuit 425, and the third segment S3 may be programmed in other memory cells not adjacent to the sub decoder circuit 425. The fourth segment S4 may be used to detect a program speed of the memory cells adjacent to the sub decoder circuit 425.

For example, as described with reference to FIGS. 11 and 12, the fourth segment S4 may include data corresponding to the highest program state such as the seventh program state P7. The third segment S3 may include data corresponding to the erase state "E" or a program state(s) lower than the seventh program state P7.

As in the above description given with reference to the first page buffer 131 and the first sub check circuit 141 of FIG. 10, the nonvolatile memory device 400 may detect a program speed of memory cells adjacent to the row decoder circuit 420 by performing the first test program operation.

As in the above description given with reference to the third page buffer 133 and the third sub check circuit 143 of FIG. 10, the nonvolatile memory device 400 may detect a program speed of memory cells adjacent to the sub decoder circuit 425 by performing the second test program operation.

In an embodiment, as described with reference to FIGS. 8 and 9, the pass/fail check circuit 440 may detect, a program speed, from the number of program loops performed until data of the first segment S1 or data of the fourth segment S4 are completely programmed, or the number of fail bits detected from a result of the verify read operation associated with the first segment S1 or the fourth segment S4 after the k-th program loop is performed.

Figure 17:
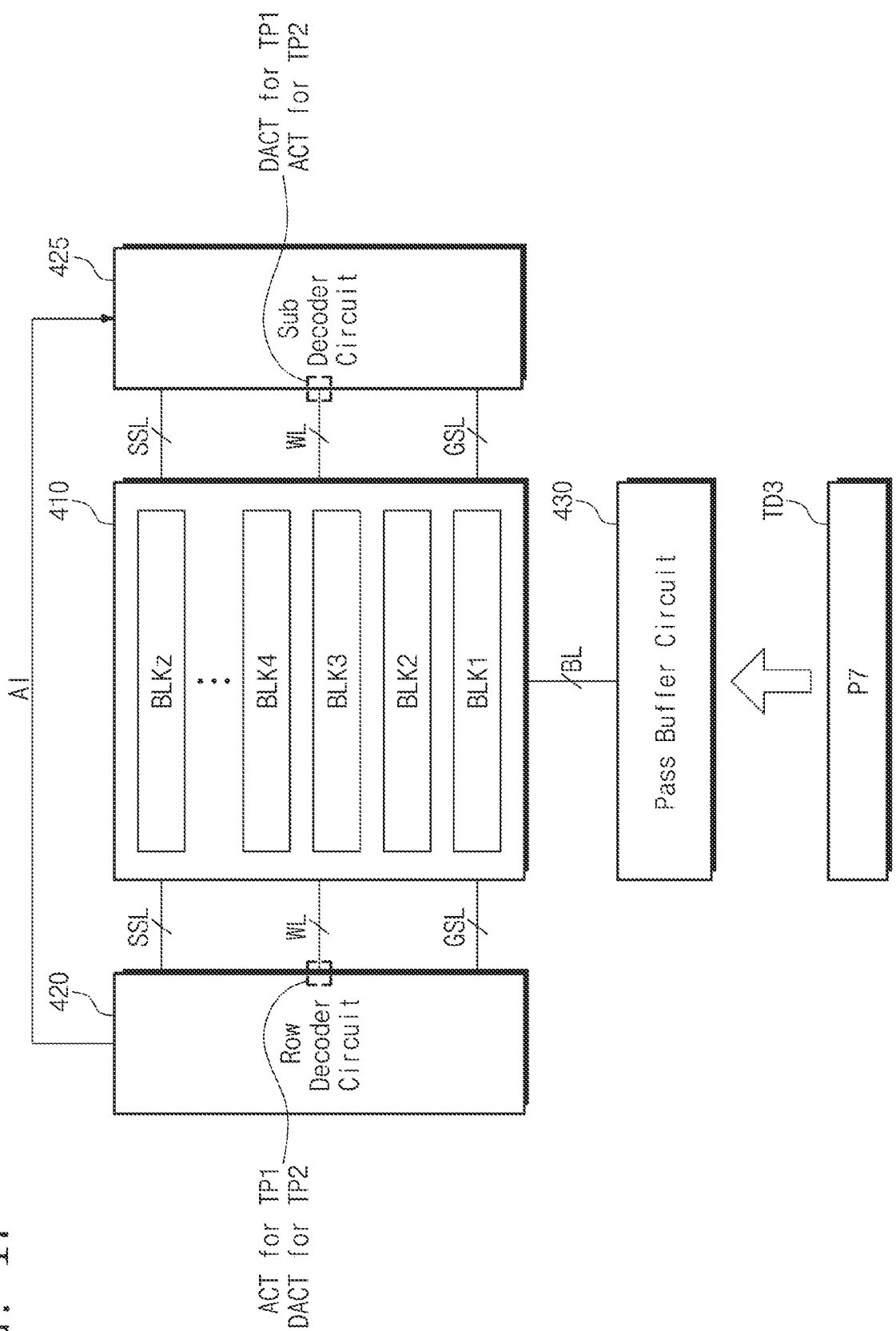
FIG. 17 illustrates another example in which test program operations are performed in a nonvolatile memory device.

FIG. 17 illustrates another example in which test program operations are performed in the nonvolatile memory device 400. Referring to FIGS. 14 and 17, a first test program operation TP1 and a second test program operation TP2 may be performed by using third test data TD3. As described with reference to FIGS. 11 and 12, the third test data TD3 may include data corresponding to the highest program state such as the seventh program state P7.

In the first test program operation TP1, the row decoder circuit 420 may be activated such that a program voltage is applied to a selected wordline of the wordlines WL (refer to ACT for TP1 in FIG. 17). In the first test program operation TP1, the sub decoder circuit 425 may be deactivated such that the program voltage is not applied to the selected wordline of the wordlines WL (refer to DACT for TP1 in FIG. 17). The nonvolatile memory device 400 may detect a program speed corresponding to the row decoder circuit 420 by using the first test program operation TP1.

In the second test program operation TP2, the row decoder circuit 420 may be deactivated such that the program voltage is not applied to the selected wordline of the wordlines WL (refer to DACT for TP2 in FIG. 17). In the second test program operation TP2, the sub decoder circuit 425 may be activated such that the program voltage is applied to the selected wordline of the wordlines WL (refer to ACT for TP2 in FIG. 17). The nonvolatile memory device 400 may detect a program speed corresponding to the sub decoder circuit 425 by using the second test program operation TP2.

In an embodiment, as described with reference to FIGS. 8 and 9, the pass/fail check circuit 440 may detect, a program speed, from the number of program loops performed until memory cells are completely programmed in the first test program operation TP1 or the second test program operation TP2, or the number of fail bits detected from the result of the verify read operation after the k-th program loop is performed.

Figure 18:
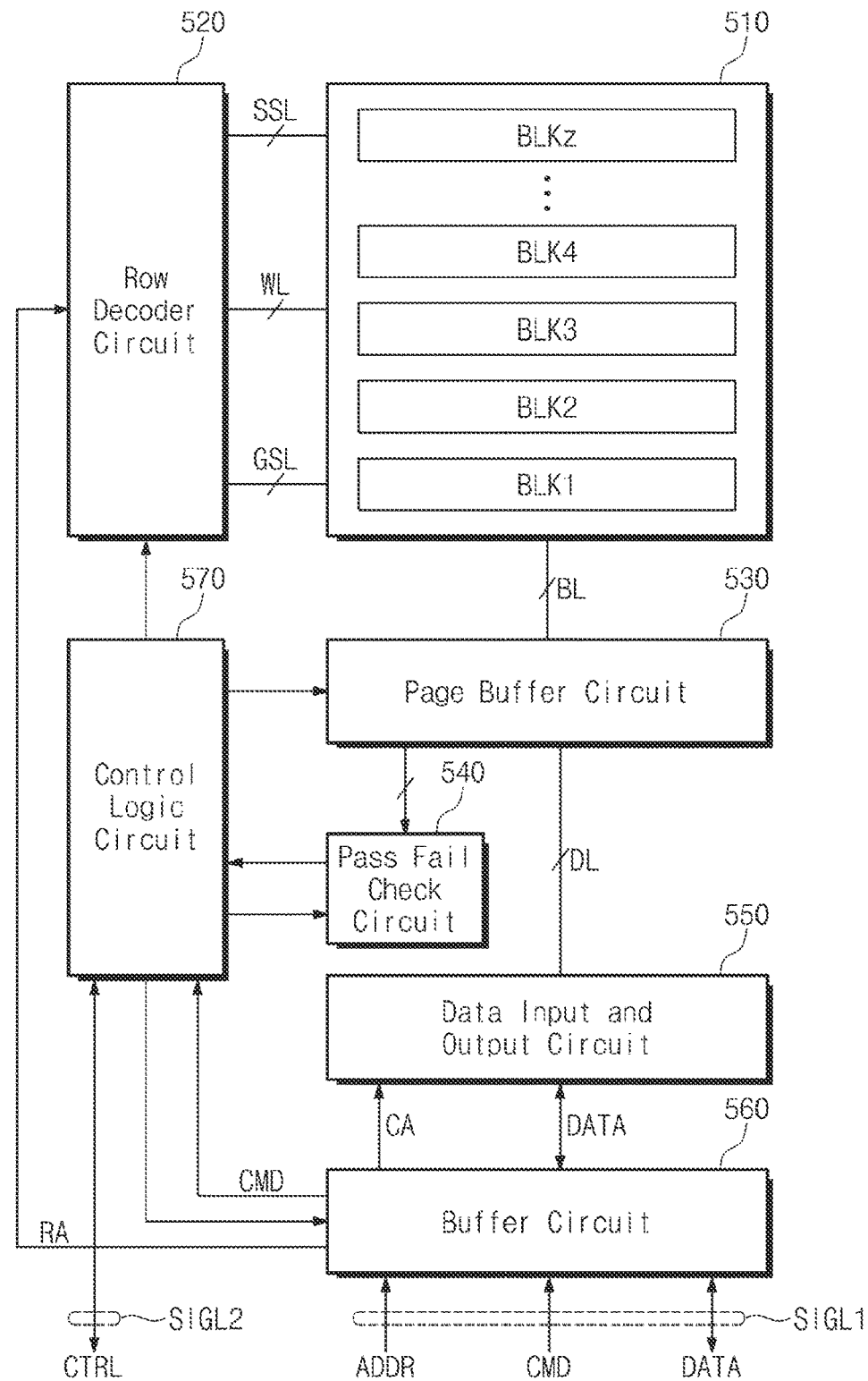
FIG. 18 is a block diagram illustrating a nonvolatile memory device according to an embodiment of the present disclosure.

FIG. 18 is a block diagram illustrating a nonvolatile memory device 500 according to a fourth embodiment of the present disclosure. Referring to FIG. 18, the nonvolatile memory device 500 includes a memory cell array 510, a row decoder circuit 520, a page buffer circuit 530, a pass/fail check circuit (PFC) 540, a data input and output circuit 550, a buffer circuit 560, and a control logic circuit 570. Compared to the nonvolatile memory device 400 of FIG. 14, the nonvolatile memory device 500 does not include the sub decoder circuit 425.

As described with reference to FIG. 13, the nonvolatile memory device 500 may store reference values indicating average program speeds according to environment information of the nonvolatile memory device 500, such as the number of program/erase cycles (or a program/erase count) or a temperature profile including a temperature change, in the form of a table. Alternatively, the nonvolatile memory device 500 may store, as reference values, program speeds of memory cells that belong to the same memory block and are connected with different wordlines.

The nonvolatile memory device 500 may compare the program speed(s) detected by at least one of the first to n-th sub check circuits 341 to 34n with the reference values. When a difference between the detected program speed(s) and a reference value is greater than a fourth threshold value, the nonvolatile memory device 500 may determine the program fail.

Figure 19:
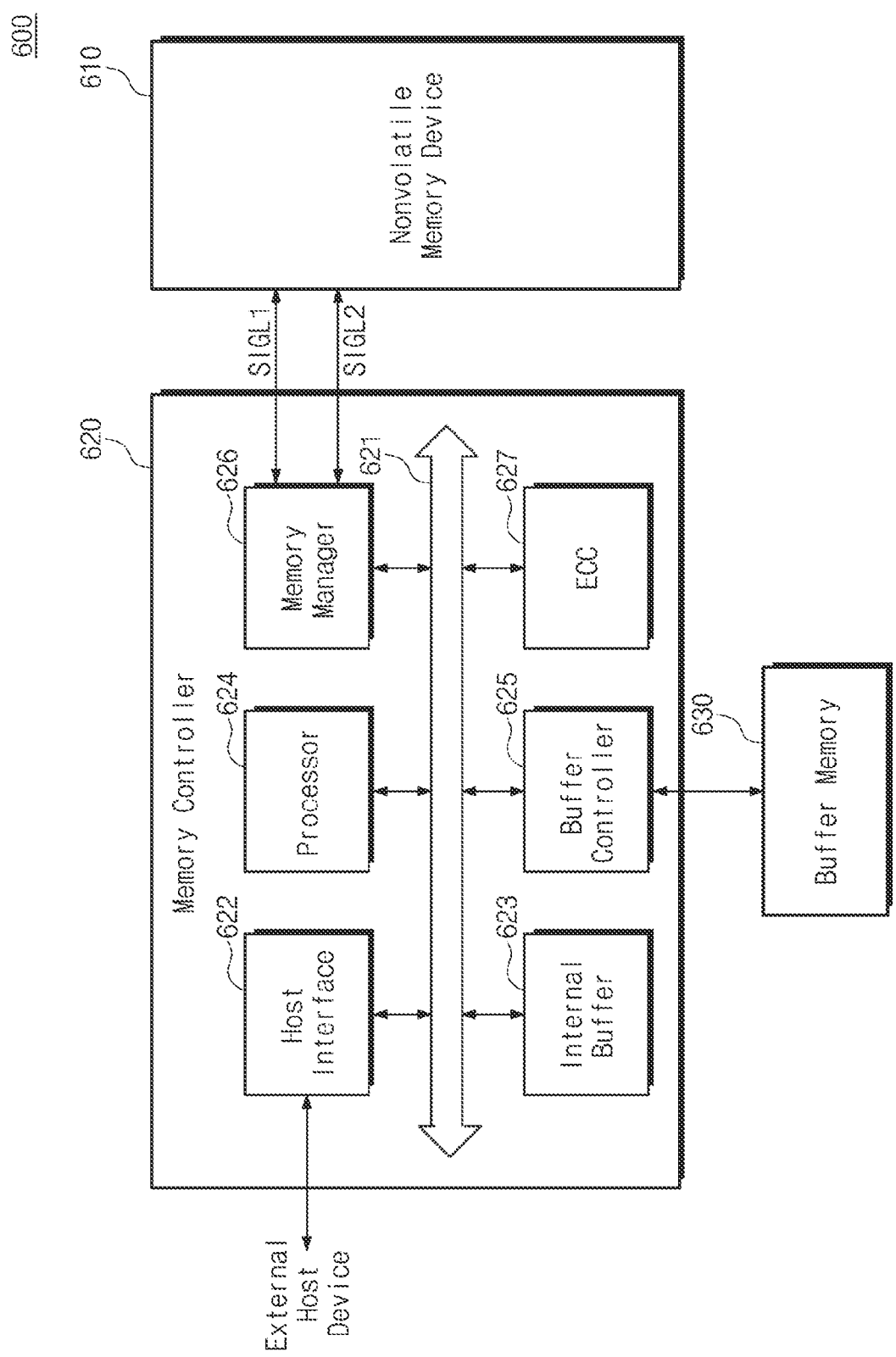
FIG. 19 illustrates a storage device according to an embodiment of the present disclosure.

FIG. 19 illustrates a storage device 600 according to an embodiment of the present disclosure. Referring to FIG. 19, the storage device 600 may include a nonvolatile memory device 610, a memory controller 620, and an external buffer 630. The nonvolatile memory device 610 may include a plurality of memory cells. Each of the plurality of memory cells may store two or more bits.

For example, the nonvolatile memory device 610 may include at least one of various nonvolatile memory devices such as a flash memory device, a phase change memory device, a ferroelectric memory device, a magnetic memory device, and a resistive memory device. For example, the nonvolatile memory device 610 may include at least one of the nonvolatile memory devices 100, 300, 400, and 500 described with reference to FIGS. 1 to 18.

The memory controller 620 may receive various requests for writing data in the nonvolatile memory device 610 or reading data from the nonvolatile memory device 610 from an external host device. The memory controller 620 may store (or buffer) user data transmitted/received to/from the external host device in the external buffer 630 and may store metadata for managing the storage device 600 in the external buffer 630.

The memory controller 620 may access the nonvolatile memory device 610 through first signal lines SIGL1 and second signal lines SIGL2. For example, the memory controller 620 may send a command and an address to the nonvolatile memory device 610 through the first signal lines SIGL1. The memory controller 620 may exchange data with the nonvolatile memory device 610 through the first signal lines SIGL1.

The memory controller 620 may send a first control signal to the nonvolatile memory device 610 through the second signal lines SIGL2. The memory controller 620 may receive a second control signal from the nonvolatile memory device 610 through the second signal lines SIGL2.

In an embodiment, the memory controller 620 may be configured to control two or more nonvolatile memory devices. The memory controller 620 may provide first signal lines and second signal lines for each of the two or more nonvolatile memory devices.

As another example, the memory controller 620 may provide first signal lines so as to be shared by the two or more nonvolatile memory devices. The memory controller 620 may provide a part of second signal lines so as to be shared by the two or more nonvolatile memory devices and may separately provide the remaining part thereof.

The external buffer 630 may include a random access memory. For example, the external buffer 630 may include at least one of a dynamic random access memory, a phase change random access memory, a ferroelectric random access memory, a magnetic random access memory, and a resistive random access memory.

The memory controller 620 may include a bus 621, a host interface 622, an internal buffer 623, a processor 624, a buffer controller 625, a memory manager 626, and an error correction code (ECC) block 627.

The bus 621 may provide communication channels between the components in the memory controller 620. The host interface 622 may receive various requests from the external host device and may parse the received requests. The host interface 622 may store the parsed requests in the internal buffer 623.

The host interface 622 may send various responses to the external host device. The host interface 622 may exchange signals with the external host device in compliance with a given communication protocol. The internal buffer 623 may include a random access memory. For example, the internal buffer 623 may include a static random access memory or a dynamic random access memory.

The processor 624 may drive an operating system or firmware for an operation of the memory controller 620. The processor 624 may read the parsed requests stored in the internal buffer 623 and may generate commands and addresses for controlling the nonvolatile memory device 610. The processor 624 may provide the generated commands and addresses to the memory manager 626.

The processor 624 may store various metadata for managing the storage device 600 in the internal buffer 623. The processor 624 may access the external buffer 630 through the buffer controller 625. The processor 624 may control the buffer controller 625 and the memory manager 626 such that user data stored in the external buffer 630 are provided to the nonvolatile memory device 610.

The processor 624 may control the host interface 622 and the buffer controller 625 such that the data stored in the external buffer 630 are provided to the external host device. The processor 624 may control the buffer controller 625 and the memory manager 626 such that data received from the nonvolatile memory device 610 are stored in the external buffer 630. The processor 624 may control the host interface 622 and the buffer controller 625 such that data received from the external host device are stored in the external buffer 630.

Under control of the processor 624, the buffer controller 625 may write data in the external buffer 630 or may read data from the external buffer 630. The memory manager 626 may communicate with the nonvolatile memory device 610 through the first signal lines SIGL1 and the second signal lines SIGL2 under control of the processor 624.

The memory manager 626 may access the nonvolatile memory device 610 under control of the processor 624. For example, the memory manager 626 may access the nonvolatile memory device 610 through the first signal lines SIGL1 and the second signal lines SIGL2. The memory manager 626 may communicate with the nonvolatile memory device 610, based on a protocol that is defined in compliance with the standard or is defined by a manufacturer.

The error correction code block 627 may perform error correction encoding on data to be provided to the nonvolatile memory device 610 by using an error correction code (ECC). The error correction code block 627 may perform error correction decoding on data received from the nonvolatile memory device 610 by using the error correction code (ECC).

In an embodiment, the storage device 600 does not include the external buffer 630 and the buffer controller 625. When the external buffer 630 and the buffer controller 625 are not included, the above functions of the external buffer 630 and the buffer controller 625 may be performed by the internal buffer 623.

Figure 20:
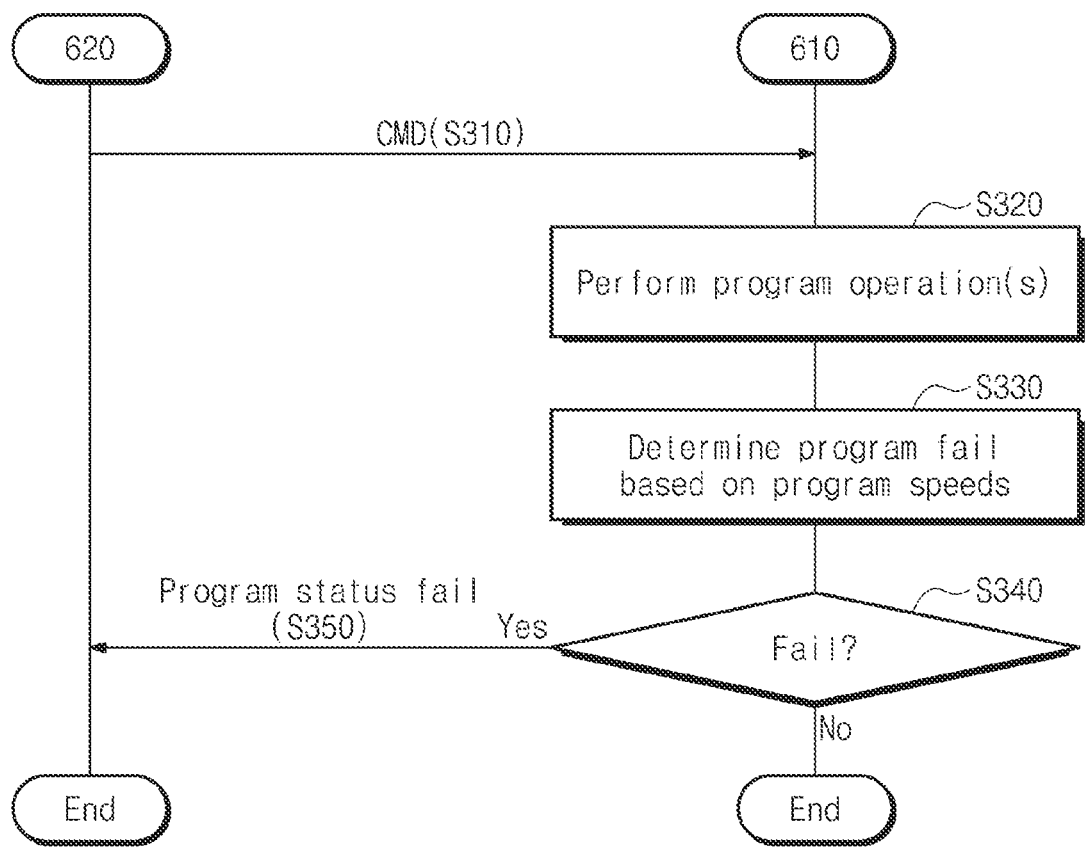
FIG. 20 illustrates an example of an operating method of a storage device of FIG. 19 according to an embodiment of the present disclosure.

FIG. 20 illustrates an example of an operating method of the storage device 600 of FIG. 19. Referring to FIGS. 19 and 20, in operation S310, the memory controller 620 sends a command CMD to the nonvolatile memory device 610. In operation S320, the nonvolatile memory device 610 performs program operation(s) in response to the command CMD, as described with reference to FIGS. 1 to 18. For example, the nonvolatile memory device 610 may perform the program operation(s) to detect program speeds.

In operation S330, the nonvolatile memory device 610 may determine the program fail based on the program speeds, as described with reference to FIGS. 1 to 18. When the fail is determined in operation S340, the nonvolatile memory device 610 may send a program status fail (PSF) signal to the memory controller 620. When the fail is not determined in operation S340, the nonvolatile memory device 610 may terminate the program operation.

In an embodiment, the command CMD may include a program command. In the case of programming data in the nonvolatile memory device 610, the memory controller 620 may send the program command, an address, and data to the nonvolatile memory device 610.

As another example, the command CMD may include a test program command. In the case of testing memory cells connected with a specific wordline (or sub wordline) of the nonvolatile memory device 610, the memory controller 620 may send the test program command and an address to the nonvolatile memory device 610. For example, the memory controller 620 may send the test program command periodically for a certain period of time.

The memory controller 620 may send or may not send the test data or dummy data not associated with the program operation and the test program operation to the nonvolatile memory device 610. When the memory controller 620 does not send the test data, the nonvolatile memory device 610 may internally generate the test data.

Based on the number of program/erase cycles of each of the memory blocks BLK1 to BLKz (refer to FIG. 1) of the nonvolatile memory device 610, for example, in response to that the number of program/erase cycles reaches one of different threshold values (e.g., 100, 200, and 300), the memory controller 620 may send the test program command associated with all or a part of wordlines of the corresponding memory block. The memory controller 620 may receive and store the threshold values from a user.

The memory controller 620 may send the test program command to the nonvolatile memory device 610, based on a temperature profile of the nonvolatile memory device 610, for example, in response to that a temperature change (e.g., a temperature change per unit time, a total temperature change, or an accumulated temperature change) occurring in the nonvolatile memory device 610 reaches a threshold value. The memory controller 620 may receive and store the threshold value from the user.

The memory controller 620 may send, to the nonvolatile memory device 610, the test program command for memory cells where the program fail occurs, based on that the program fail occurs in the nonvolatile memory device 610.

As described above, the nonvolatile memory device 100, 300, 400, or 500 according to embodiments of the present disclosure may detect a resistive fault between the row decoder circuit 120, 320, 420, or 520 and the memory cell array 110, 310, 410, and 510 or a resistive fault between the sub decoder circuit 125 or 425 and the memory cell array 110 or 410. Accordingly, it is possible to manage faults of the nonvolatile memory device 100, 300, 400, or 500, and the reliability of the nonvolatile memory device 100, 300, 400, or 500 and the storage device 600 including the nonvolatile memory device 100, 300, 400, or 500 may be increased.

In the above embodiments, components according to the present disclosure are described by using the terms "first", "second", "third", etc. However, the terms "first", "second", "third", etc. may be used to distinguish components from each other and do not limit the present disclosure. For example, the terms "first", "second", "third", etc. need not denote a certain order.

In the above embodiments, components according to embodiments of the present disclosure are referenced by using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit, or circuits enrolled as an intellectual property (IP).

According to the present disclosure, a nonvolatile memory device may detect a resistive fault. Accordingly, a nonvolatile memory device capable of preventing data from being written in faulty (or defective) memory cells and increasing reliability and a storage device including the nonvolatile memory device are provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A nonvolatile memory device comprising:
a memory cell array including a plurality of memory cells arranged in rows and columns, wherein two or more of the memory cells are stacked in a direction perpendicular to a substrate;
a row decoder circuit connected with the rows of the memory cells through wordlines, and configured to select one wordline of the wordlines as a target of a program operation in the program operation;
a page buffer circuit connected with the columns of the memory cells through bitlines, and configured to store data to be written in the memory cells connected with the selected wordline in the program operation; and
a pass/fail check circuit connected with the page buffer circuit, and configured to determine a pass or a fail of the program operation in the program operation,
wherein the bitlines include bitlines of a first bitline group and bitlines of a second bitline group, and
wherein, in the program operation, the pass/fail check circuit detects a first program speed of first memory cells connected with the bitlines of the first bitline group from among the memory cells connected with the selected wordline and a second program speed of second memory cells connected with the bitlines of the second bitline group from among the memory cells connected with the selected wordline, and determines a program fail based on the first program speed and the second program speed.

2. The nonvolatile memory device of claim 1, wherein the program operation is performed in response to receipt of a program command from an external host device, and
wherein the data is received together with the program command.

3. The nonvolatile memory device of claim 1, wherein the program operation is performed in response to receipt of a test command from an external host device, and
wherein the data is test data.

4. The nonvolatile memory device of claim 3, wherein the test data is used to program the memory cells connected with the selected wordline to one program state.

5. The nonvolatile memory device of claim 1, wherein the program operation includes a plurality of program loops, each of which includes a program step of applying a program voltage and a verify step of performing a read operation by using a verification voltage, and
wherein the pass/fail check circuit detects the first program speed from the number of program loops performed until the first memory cells are completely programmed and detects the second program speed from the number of program loops performed until the second memory cells are completely programmed.

6. The nonvolatile memory device of claim 1, wherein the program operation includes a plurality of program loops, each of which includes a program step of applying a program voltage and a verify step of performing a read operation by using a verification voltage, and
wherein the pass/fail check circuit detects the first program speed from a number of fail bits of the first memory cells in a verify operation of a k-th program loop and detects the second program speed from a number of fail bits of the second memory cells in the verify operation of the k-th program loop, where k is a positive integer.

7. The nonvolatile memory device of claim 6, wherein the pass/fail check circuit detects the first program speed and the second program speed based on a program state being a highest state from among program states to which the memory cells are programmed.

8. The nonvolatile memory device of claim 1, wherein, when a difference between the first program speed and the second program speed is greater than a threshold value, the pass/fail check circuit determines that the program operation fails.

9. The nonvolatile memory device of claim 1, wherein the bitlines further include bitlines of a third bitline group, and
wherein the bitlines are provided in the order of the bitlines of the first bitline group, the bitlines of the third bitline group, and the bitlines of the second bitline group from the row decoder circuit.

10. The nonvolatile memory device of claim 1, further comprising:
a sub decoder circuit connected with the rows of the memory cells through the wordlines, and configured to select the one wordline together with the row decoder circuit in the program operation,
wherein the memory cell array is connected between the row decoder circuit and the sub decoder circuit through the wordlines.

11. A nonvolatile memory device comprising:
a memory cell array including a plurality of memory cells arranged in rows and columns, wherein two or more of the memory cells are stacked in a direction perpendicular to a substrate;
a row decoder circuit connected with the rows of the memory cells through wordlines, and configured to select one wordline of the wordlines in a test operation including a first program operation and a second program operation as a target of the first and second program operations;
a page buffer circuit connected with the columns of the memory cells through bitlines, and configured to store first data to be written in the memory cells connected with the selected wordline in the first program operation and to store second data to be written in the memory cells connected with the selected wordline in the second program operation; and a pass/fail check circuit connected with the page buffer circuit, and configured to determine a pass or a fail of each of the first program operation and the second program operation in the test operation, wherein the pass/fail check circuit detects a first program speed from the memory cells connected with the selected wordline in the first program operation, detects a second program speed from the memory cells connected with the selected wordline in the second program operation, and determines a test fail based on the first program speed and the second program speed.

12. The nonvolatile memory device of claim 11, wherein the first data include a first segment and a second segment, the first segment includes data corresponding to a highest program state, and the second segment includes data corresponding to an erase state.

13. The nonvolatile memory device of claim 12, wherein the second data include a third segment and a fourth segment, the third segment includes data corresponding to the erase state, and the fourth segment includes data corresponding to the highest program state.

14. The nonvolatile memory device of claim 13, wherein the first segment and the third segment correspond to memory cells adjacent to the row decoder circuit from among the memory cells connected with the selected wordline, and wherein the second segment and the fourth segment correspond to memory cells non-adjacent the row decoder circuit from among the memory cells connected with the selected wordline.

15. The nonvolatile memory device of claim 11, further comprising:

a sub decoder circuit connected with the rows of the memory cells through the wordlines, and configured to select the one wordline together with the row decoder circuit in the program operation, wherein the memory cell array is connected between the row decoder circuit and the sub decoder circuit through the wordlines.

16. The nonvolatile memory device of claim 15, wherein the first program operation includes a plurality of program loops, each of which includes a program step of applying a program voltage and a verify step of performing a read operation by using a verification voltage, and wherein, in the first program operation, the row decoder circuit applies the program voltage to the selected wordline, and the sub decoder circuit does not apply the program voltage to the selected wordline.

17. The nonvolatile memory device of claim 15, wherein the second program operation includes a plurality of program loops, each of which includes a program step of applying a program voltage and a verify step of performing a read operation by using a verification voltage, and wherein, in the second program operation, the row decoder circuit does not apply the program voltage to the selected wordline, and the sub decoder circuit applies the program voltage to the selected wordline.

18. A storage device comprising:

a nonvolatile memory device including a memory cell array including a plurality of memory cells connected with a plurality of wordlines and a plurality of bitlines, wherein two or more of the memory cells are stacked in a direction perpendicular to a substrate; and a memory controller connected with the nonvolatile memory device to control the nonvolatile memory device, wherein, when a test command is provided from the memory controller, the nonvolatile memory device detects a difference between program speeds of memory cells connected with a selected wordline of the plurality of wordlines by performing at least one program operation on the memory cells connected with the selected wordline based on test data and sends a program status fail signal to the memory controller when the difference between the program speeds is greater than a threshold, and wherein the memory controller sends the test command to the nonvolatile memory device based on a number of program/erase cycles of the nonvolatile memory device, a temperature profile of the nonvolatile memory device, or when a program fail occurs in the nonvolatile memory device.

19. The storage device of claim 18, wherein, when the memory controller writes data in the nonvolatile memory device, the memory controller sends a program command and program data to the nonvolatile memory device, and wherein the nonvolatile memory device detects a difference between program speeds of the memory cells connected with a selected wordline of the plurality of wordlines by performing at least one program operation on the memory cells connected with the selected wordline based on the program data and sends a program status fail signal to the memory controller when the difference between the program speeds is greater than a threshold.

20. The storage device of claim 18, wherein the test data is used to program the memory cells connected with the selected wordline to one program state.

* * * * *